US012730224B2

(12) United States Patent
Park et al.

(10) Patent No.: US 12,730,224 B2
(45) Date of Patent: Sep. 8, 2026

(54) THREE-DIMENSIONAL DISTANCE INFORMATION ACQUISITION SYSTEM AND ELECTRONIC DEVICE INCLUDING THE SAME

(71) Applicant: SAMSUNG ELECTRONICS CO., LTD., Suwon-si (KR)

(72) Inventors: Junghyun Park, Seoul (KR); Sunil Kim, Osan-si (KR); Minkyung Lee, Suwon-si (KR); Byunggil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1055 days.

(21) Appl. No.: 17/867,285

(22) Filed: Jul. 18, 2022

(65) Prior Publication Data

US 2023/0204782 A1 Jun. 29, 2023

(30) Foreign Application Priority Data

Dec. 29, 2021 (KR) ........................ 10-2021-0191746
Feb. 10, 2022 (KR) ........................ 10-2022-0017739

(51) Int. Cl.

| | |
|---|---|
| ***G01S 17/894*** | (2020.01) |
| ***G01S 7/481*** | (2006.01) |
| ***G01S 7/4865*** | (2020.01) |
| ***G01S 17/10*** | (2020.01) |
| ***H01S 5/125*** | (2006.01) |

(52) U.S. Cl.
CPC .......... *G01S 17/894* (2020.01); *G01S 7/4814* (2013.01); *G01S 7/4865* (2013.01); *G01S 17/10* (2013.01); *H01S 5/125* (2013.01)

(58) Field of Classification Search
None
See application file for complete search history.

(56) References Cited

U.S. PATENT DOCUMENTS

| | | | | |
|---|---|---|---|---|
| 9,825,425 | B2 | 11/2017 | Mor | |
| 11,237,251 | B2 * | 2/2022 | Bartlett | G01S 17/931 |
| 2010/0046953 | A1 * | 2/2010 | Shaw | H01S 5/423 398/115 |
| 2018/0196138 | A1 * | 7/2018 | Lee | G02F 1/21 |
| 2021/0096261 | A1 | 4/2021 | Angus | |
| 2021/0103085 | A1 | 4/2021 | Joo et al. | |
| 2021/0325517 | A1 | 10/2021 | Park et al. | |
| 2022/0019096 | A1 * | 1/2022 | Nomoto | G02F 1/0151 |

FOREIGN PATENT DOCUMENTS

| | | |
|---|---|---|
| KR | 10-2017-0005649 A | 1/2017 |
| KR | 10-2018-0015288 A | 2/2018 |
| KR | 10-1981124 B1 | 5/2019 |

* cited by examiner

*Primary Examiner* — Luke D Ratcliffe
(74) *Attorney, Agent, or Firm* — Sughrue Mion, PLLC

(57) ABSTRACT

A three-dimensional (3D) distance information acquisition system and an electronic device including the same are provided. The 3D distance information acquisition system includes: a transmitter including a light source configured to emit a light based on a time division method and a spatial light modulator configured to steer the light incident from the light source to each scan point on an object; a receiver including a photodetector configured to detect the light reflected from the scan point of the object; and a processor configured to obtain 3D distance information based on the light detected by the receiver.

19 Claims, 25 Drawing Sheets

THREE-DIMENSIONAL DISTANCE INFORMATION ACQUISITION SYSTEM AND ELECTRONIC DEVICE INCLUDING THE SAME

CROSS-REFERENCE TO RELATED APPLICATIONS

This application is based on and claims priority under 35 U.S.C. § 119 to Korean Patent Application Nos. 10-2021-0191746, filed on Dec. 29, 2021 and 10-2022-0017739 filed on Feb. 10, 2022 in the Korean Intellectual Property Office, the disclosures of which are incorporated by reference herein in their entireties.

BACKGROUND

1. Field

Apparatuses and methods consistent with one or more example embodiments relate to a three-dimensional (3D) distance information acquisition system and an electronic device including the same.

2. Description of the Related Art

A three-dimensional (3D) image may be obtained using a diffractive optical element (DOE) replicating light emitted and proceeding from a light source of a transmitter in various directions (i.e., pattern replica). A pulse light may be generated by turning on and off a light source for a short time period, (e.g., several nanoseconds), and a receiver may convert the pulse light reflected and returning from an object into an electrical signal. A distance may be measured by extracting a peak value of the electrical signal and using a time difference with the transmitter.

As such, when the pulse light emitted from the light source is divided by a DOE, optical power may be lowered. Low optical power may lead to a limited range of a detectable distance. To overcome this, a multi-pulse may be used to repeatedly measure the same distance measurement several times, and thereby to reduce noise. As a result, the detectable distance may be expanded with the same peak power. However, such a method may involve increased measurement time at one point (i.e., a dwell time) in the process of repeating the measurement.

SUMMARY

One or more example embodiments provide three-dimensional (3D) distance information acquisition systems capable of securing a sufficient detectable distance when acquiring 3D distance information.

Further, one or more example embodiments provide 3D distance information acquisition systems capable of securing a sufficient detectable distance and applicable to a mobile device.

Still further, one or more example embodiments provide electronic devices including a 3D distance information acquisition system.

According to an aspect of an example embodiment, a three-dimensional (3D) distance information acquisition system may include: a transmitter including a light source configured to emit a light based on a time division method and a spatial light modulator configured to steer the light incident from the light source to each scan point on an object; a receiver including a photodetector configured to detect the light reflected from the scan point of the object; and a processor configured to obtain 3D distance information based on the light detected by the receiver.

The spatial light modulator may include: a first material layer; a cavity provided on the first material layer; and a second material layer including a grating structure provided on the cavity.

The spatial light modulator may include a plurality of pixels for steering the incident light by phase modulation, and each of the plurality of pixels may include a stacked structure including the first material layer, the cavity, and the second material layer.

The grating structure may include any one of a positive-intrinsic-negative (PIN) semiconductor structure, a negative-intrinsic-negative (NIN) semiconductor structure, and a positive-intrinsic-positive (PIP) semiconductor structure.

The cavity may include $SiO_2$, and the grating structure may include a PIN structure including Si.

A pitch of the grating structure may be less than a wavelength of the light modulated by the spatial light modulator.

The first material layer may include a distributed Bragg reflector.

The first material layer may include a structure in which Si layers and $SiO_2$ layers are repeatedly stacked.

The spatial light modulator may be provided to modulate a phase by controlling a resonance condition by changing a refractive index of the grating structure by external electric stimulation.

The spatial light modulator may be a transmissive type or a reflective type.

The light source may include any one of an edge emitting laser, a vertical cavity surface emitting laser, and a photonic crystal surface emitting laser.

The transmitter may further include a collimating lens configured to collimate the light emitted from the light source.

The transmitter may further include an outgoing optical system, and the outgoing optical system may include a diverging lens configured to expand a range of beam steering by the spatial light modulator.

The diverging lens may include a concave lens or a cylinder lens in which at least one lens surface is concave.

The photodetector may further include any one of a silicon photomultiplier (SiPM), an avalanche photo diode (APD), and a single photon avalanche diode (SPAD).

When a direction in which the light emitted from the light source proceeds towards the spatial light modulator is a first proceeding direction, and a direction in which the light steered by the spatial light modulator proceeds is a second proceeding direction, the spatial light modulator may be disposed to be inclined with respect to a plane that extends in the first proceeding direction and the second proceeding direction.

When a direction in which the light emitted from the light source proceeds towards the spatial light modulator is a first proceeding direction, and a direction in which the light steered by the spatial light modulator proceeds is a second proceeding direction, the spatial light modulator may be disposed to be perpendicular to a plane that extends in the first proceeding direction and the second proceeding direction, and may further include an inclined mirror member configured to reflect light steered by the spatial light modulator in a direction out of the plane.

An electronic device may include at least one sensor of a distance sensor, a three-dimensional (3D) sensor, and a light detection and ranging (LiDAR) sensor, wherein the 3D distance information acquisition system may be provided as the at least one sensor.

The at least one sensor may include a LIDAR sensor or a depth camera for a mobile device.

According to another aspect of the disclosure, a distance sensor may include: a transmitter including a light source configured to turn on all semiconductor-based laser diodes of the light source at each scan time, and emit a collimated pencil beam using the semiconductor-based laser diodes at each scan time, and a spatial light modulator configured to steer the collimated pencil beam incident from the light source to each scan point on an object; a receiver including a photodetector configured to detect light reflected from the scan point of the object; and a processor configured to obtain 3D distance information based on the light detected by the receiver.

BRIEF DESCRIPTION OF THE DRAWINGS

The above and/or other aspects will be more apparent by describing certain example embodiments, with reference to the accompanying drawings, in which.

DETAILED DESCRIPTION

Figure 1:
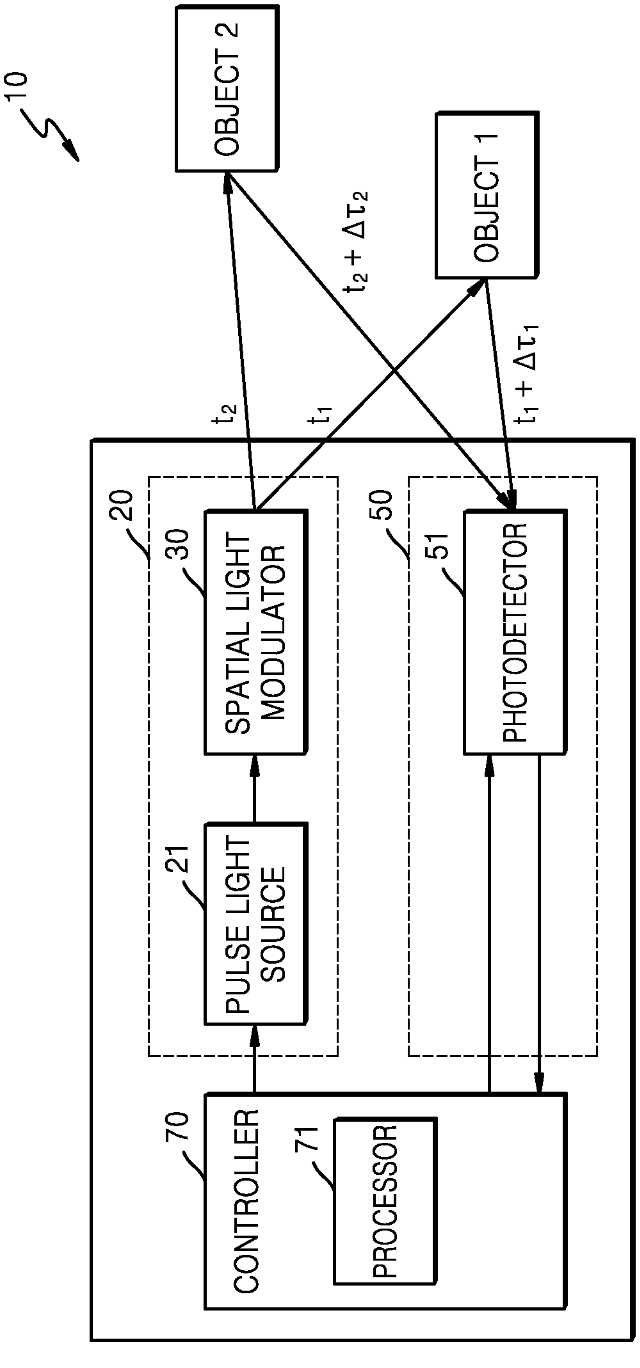
FIG. 1 is a schematic diagram of a three-dimensional (3D) distance information acquisition system according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

While such terms as "first," "second," etc., may be used to describe various elements, such elements must not be limited to the above terms. The above terms may be used only to distinguish one element from another.

It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. When a portion "includes" an element, another element may be further included, rather than excluding the existence of the other element, unless otherwise described.

The use of the terms "a" and "an" and "the" and similar referents in the context of describing embodiments (especially in the context of the following claims) are to be construed to cover both the singular and the plural. The operations of all methods described herein can be performed in any suitable order unless otherwise indicated herein or otherwise clearly contradicted by context, and embodiments are not limited to the described order of the operations.

Moreover, the terms "part," "module," etc. refer to a unit processing at least one function or operation, and may be implemented by a hardware, a software, or a combination thereof.

The connecting lines, or connectors shown in the various figures presented are intended to represent exemplary functional relationships and/or physical or logical couplings between the various elements, and thus it should be noted that many alternative or additional functional relationships, physical connections or logical connections may be present in a practical device.

The use of any and all examples, or exemplary language provided herein, is intended merely to better illuminate technical ideas and does not pose a limitation on the scope of embodiments unless otherwise claimed.

A three-dimensional (3D) distance information acquisition system according to an embodiment may be provided to obtain 3D distance information according to a time division method by implementing a beam steering element using a spatial light modulator configured to form a phase modulation array. The 3D distance information acquisition system according to an embodiment may be applied in implementing a distance sensor, a 3D sensor, a light detection and ranging (LiDAR) sensor, etc. to obtain distance information or a 3D image.

Applying a beam steering method based on mechanical rotation to a mobile device to obtain distance information or a 3D image may face a difficulty due to a form factor limitation, which requires, for example, a thickness to be less than or equal to several millimeters. Furthermore, the beam steering method based on a micro electro-mechanical system (MEMS) is vulnerable to external shocks or vibration, and thus it may be difficult to apply to a mobile device.

The 3D distance information acquisition system according to an embodiment may be operated based on a non-mechanical beam steering method, and by applying solid-state beam steering technology, the 3D distance information acquisition system may collect power of light emitted from a light source at once and perform detection only in one direction, so that sufficient optical power may be secured. Accordingly, the 3D distance information acquisition system according to an embodiment may secure a sufficient detectable distance while satisfying a form factor of a mobile device, and thus, may be applied as a LIDAR sensor, a distance sensor, and/or a 3D sensor, etc. to a mobile device. Moreover, a mobile device including a depth camera, etc., for a mobile device, may be implemented. In addition to the foregoing, the 3D distance information acquisition system may be further applied to various electronic devices, which require a LIDAR sensor, a distance sensor, a 3D sensor, etc.

Figure 2:
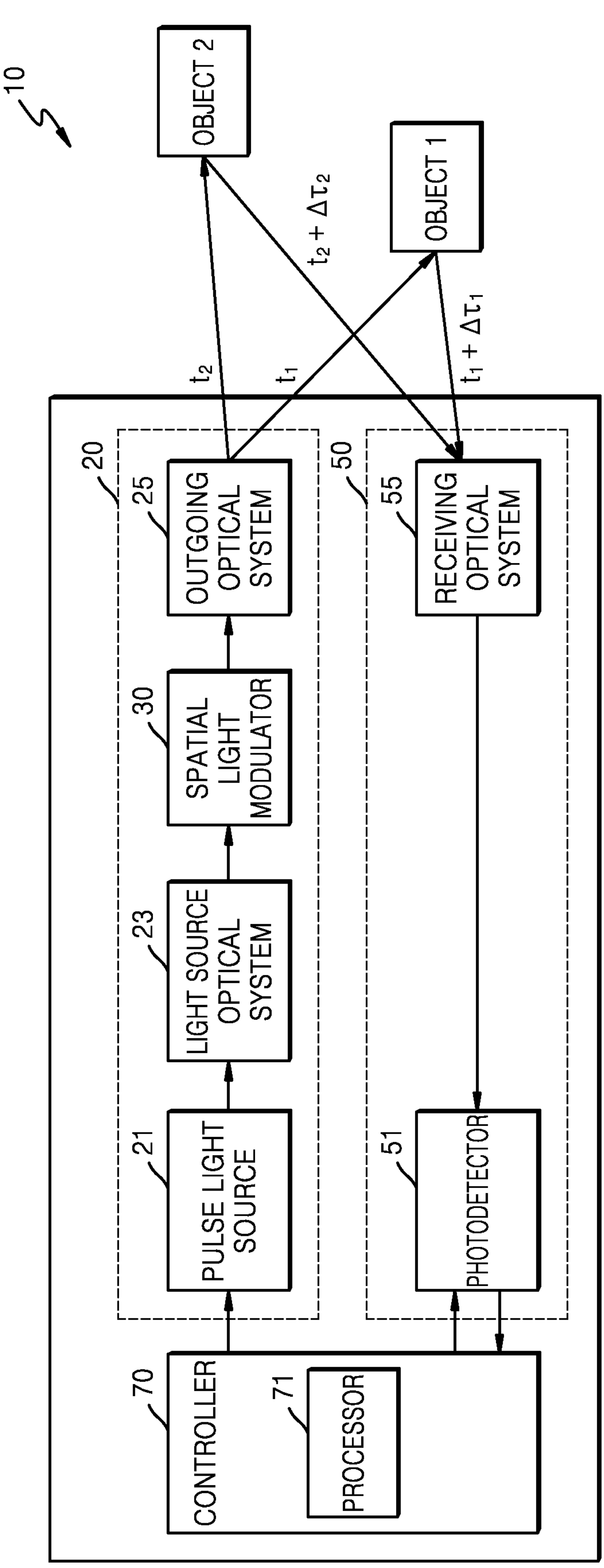
FIG. 2 is a schematic diagram of a 3D distance information acquisition system according to another example embodiment.

FIG. 1 is a schematic diagram of a 3D distance information acquisition system 10 according to an embodiment. FIG. 2 is a schematic diagram of the 3D distance information acquisition system 10 according to another embodiment.

With reference to FIGS. 1 and 2, the 3D distance information acquisition system 10 according to an embodiment may include a transmitter 20 including a pulse light source 21, and a spatial light modulator 30, a receiver 50 including a photodetector 51, and a controller (e.g., a processor 71, and an analog-to-digital converter and a digital-to-analog converter that are provided between the processor 71 and the transmitter 20 and between the processor 71 and the receiver 50) 70 configured to control the transmitter 20 and the receiver 50 to obtain 3D distance information. As illustrated in FIG. 2, the transmitter 20 may further include at least one of a light source optical system 23 and an outgoing optical system 25. As illustrated in FIG. 2, the receiver 50 may further include a receiving optical system 55. FIG. 2 illustrates an example in which the light source optical system 23, the outgoing optical system 25, and the receiving optical system 55 are provided; however, the embodiment is not limited thereto, and the 3D distance information acquisition system 10 according to an embodiment may include at least of the light source optical system 23, the outgoing optical system 25, and the receiving optical system 55.

The pulse light source 21 may be provided to emit, for example, visible light or near-infrared ray in a band of about 800 nm to about 1700 nm. The pulse light source 21 may be provided to operate as a pulse light source. The pulse light source 21 may include a laser light source driven to output pulse light. The pulse light source 21 may include at least one semiconductor laser, for example, a plurality of semiconductor laser arrays to output pulse light of a desired power. The pulse light source 21 may turn on or off all or some of the plurality of semiconductor laser arrays to output a pulse light having desired power. A semiconductor laser or a semiconductor-based laser diode applied to the pulse light source 21 may include, for example, an edge emitting laser (EEL), a vertical cavity surface emitting laser (VCSEL), or a photonic crystal surface emitting laser (PCSEL).

As such, the pulse light source 21 may include at least one semiconductor laser, which may be used as a flash semiconductor light source outputting pulse light. For example, the pulse light source 21 may include a plurality of VCSEL arrays, and may use the plurality of VCSEL arrays as a flash VCSEL light source to output pulse light.

The spatial light modulator 30 may be provided to modulate a phase of incident light to adjust a proceeding direction of light to a desired direction. The spatial light modulator 30 may include a plurality of pixels for steering incident light by the phase modulation. The pixel may be a minimum unit, which may be independently driven, or a basic unit, which may independently modulate a phase of light, in the spatial light modulator 30. The spatial light modulator 30 may have a structure in which the plurality of pixels are arranged in a one-dimensional or two-dimensional manner, and each pixel may include one or a plurality of grating structures GS. A pitch between the grating structures GS may be less than a wavelength of light to be modulated. Moreover, the spatial light modulator 30 may be provided such that a refractive index of the grating structure GS may be changed by external electric stimulation to control a resonance condition, and thus phase is modulated. A proceeding direction of light emitted from the spatial light modulator 30 may be determined by a phase relationship between light emitted from adjacent pixels.

The spatial light modulator 30 may be driven according to a phase profile provided from the controller 70 for steering light in various directions. The phase profile may be, for example, a binary electrical signal to which on signal or off signal is applied to each pixel of the spatial light modulator 30.

Figure 6A:
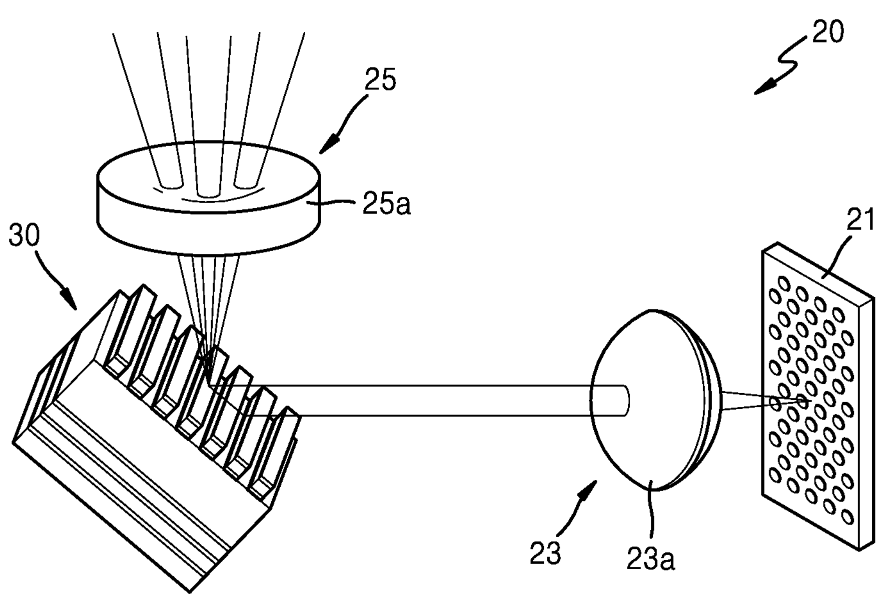
FIG. 6A is a diagram illustrating an example of an optical configuration of a transmitter applied to a 3D distance information acquisition system according to an example embodiment.
Figure 6B:
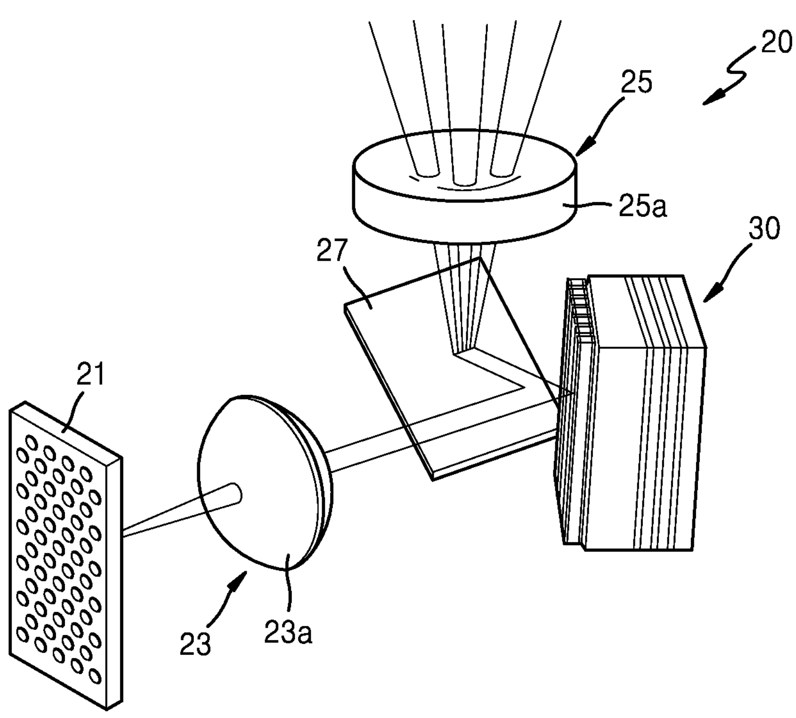
FIG. 6B is a diagram illustrating another example of an optical configuration of a transmitter applied to a 3D distance information acquisition system according to an example embodiment.
Figure 8A:
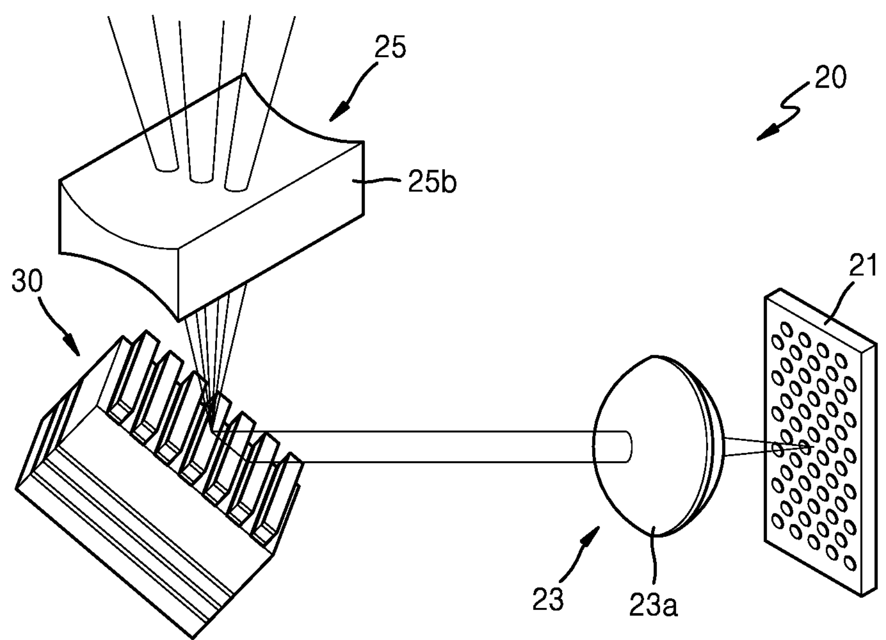
FIGS. 8A and 8B illustrate examples in which a cylinder-type diverging lens is provided in an outgoing optical system of a 3D distance information acquisition system according to an example embodiment.
Figure 8B:
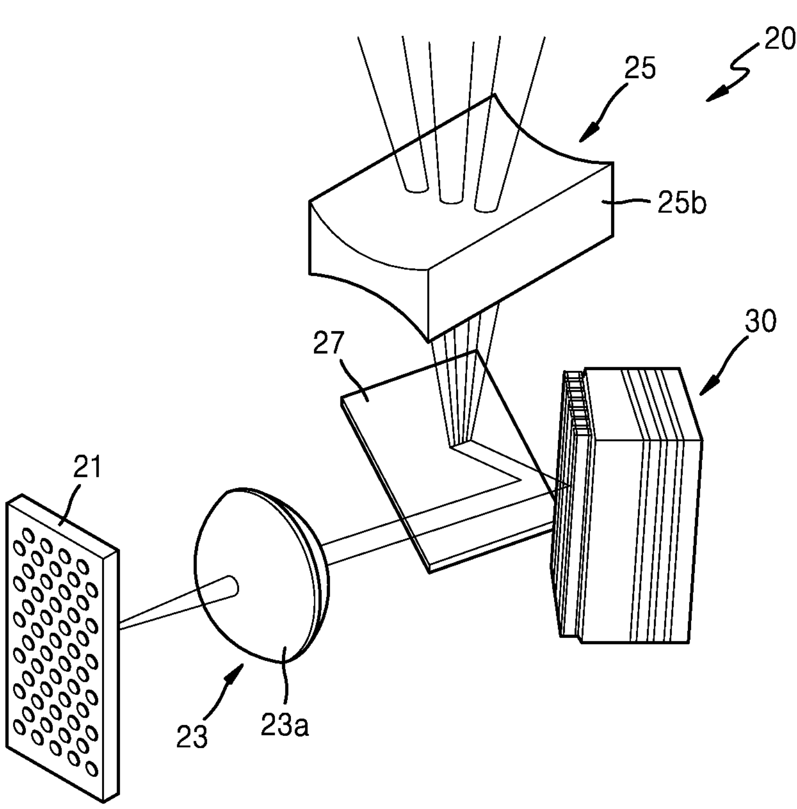

The transmitter 20 may further include at least one of the light source optical system 23 and the outgoing optical system 25. The light source optical system 23 may include, for example, a collimating lens **23*a* collimating light emitted from the pulse light source 21, as illustrated in FIGS. 6A and 6B. The collimating lens 23*a* may be arranged between the pulse light source 21 and the spatial light modulator 30. When the pulse light source 21 is provided to emit collimated light or light of which beam the cross-section is circular, the collimating lens 23***a* may be omitted. The outgoing optical system 25 may include, for example, a diverging lens 25*a* or 25*b* expanding a beam steering range of light steered by the spatial light modulator 30, as illustrated in FIGS. 6A, 6B, 8A, and 8B. The diverging lens 25*a* or 25*b* may be arranged, for example, on a path of light, which is phase-modulated and steered by the spatial light modulator 30. As illustrated in FIGS. 6A and 6B, a concave lens having one concave lens surface or both concave lens surfaces may be provided as the diverging lens 25*a*. As illustrated in FIGS. 8A and 8B, a cylinder lens having one concave lens surface or both concave lens surfaces may be provided as the diverging lens 25*b*.

The photodetector 51 may detect pulse light emitted from the transmitter 20, reflected from an object located at a scan point and returning to the 3D distance information acquisition system 10 according to an embodiment. The photodetector 51 may include, for example, a silicon photomultiplier (SiPM), an avalanche photo diode (APD), a single photon avalanche diode (SPAD), etc., and an SiPM array, an APD array, or an SPAD array may be used.

According to the 3D distance information acquisition system 10 of an embodiment, by collecting light emitted from the pulse light source 21 and using the collected light for individual point scanning and applying the spatial light modulator 30 as the beam steering element, 3D distance information may be obtained through steering of pulse light in various directions by the spatial light modulator 30, individual pixel detection may be unnecessary. Accordingly, as no photodetector array for individual pixel detection is necessary, the price of the photodetector 51 may be lowered. Furthermore, even when an SiPM array, an APD array, an SPAD array, etc., are used as the photodetector 51, by constituting a relatively low-resolution photodetector array or simplifying a circuit configuration, the price of the photodetector 51 may decrease.

The receiver 50 may further include a lens capable of condensing light reflected from a scan point, a bandpass filter to block ambient light, such as external lighting, sunlight, and the like. The bandpass filter may be arranged before the photodetector 51, and may be provided to transmit light having a wavelength similar to a light output pulse of transmitter 20 and block light of other wavelengths, and thus minimize noise due to external light. In the bandpass filter, a wavelength of light passing may shift according to an incident angle. The bandpass filter may be provided to minimize a range of the wavelength shifted when pulse light reflected and returning from an object within a beam steering range of the 3D distance information acquisition system 10 has an incident angle. In this case, in a state in which noise due to external light is minimized, pulse light for obtaining 3D distance information reflected from the object may pass through the bandpass filter and then the filtered pulse light is received by the photodetector 51.

With reference to FIGS. 1 and 2, a delay time ($\Delta\tau 1$) required for the pulse light to be reflected from a nearby object, for example, an object 1 and returned to the photodetector 51 may be short, and a delay time ($\Delta\tau 2$) required for the pulse light to be reflected from a distant object, for example, an object 2 and returned to the photodetector 51 may be long.

When the transmitter 20 emits a first pulse light to an object 1 at time t1, and emits a second pulse light to an object 2 at time t2, the photodetector 51 of the receiver 50 may detect the first pulse light that is reflected from the object 1 at time $t1+\Delta\tau 1$, and may detect the second pulse light that is reflected from the object 2 at $t2+\Delta\tau 2$. Accordingly, by using a delay time (e.g., $\Delta\tau 1$ or $\Delta\tau 2$) between an emission time and a returning time of pulse light, information regarding a distance to an object may be obtained for each angle steered by the spatial light modulator 30.

As such, the 3D distance information acquisition system 10 according to an embodiment may collect light emitted from the pulse light source 21 through a time division method and use the same for individual scan point scanning. The pulse light source 21 may emit a plurality of lights to illuminate the spatial light modulator 30 in turn, via a time division method. That is, as illustrated in FIGS. 1 and 2, the 3D distance information acquisition system 10 according to an embodiment may vary emission time (e.g., t1, t2, etc.) of pulse light arriving at each scan point, and may obtain 3D distance information by steering the pulse light in various directions using the spatial light modulator 30. Accordingly, the 3D distance information acquisition system 10 according to an embodiment may not need an addressable light source, which requires individual adjustment, and an array of photodetectors, which requires individual pixel detection, and thus, the price thereof may decrease.

Figure 3A:
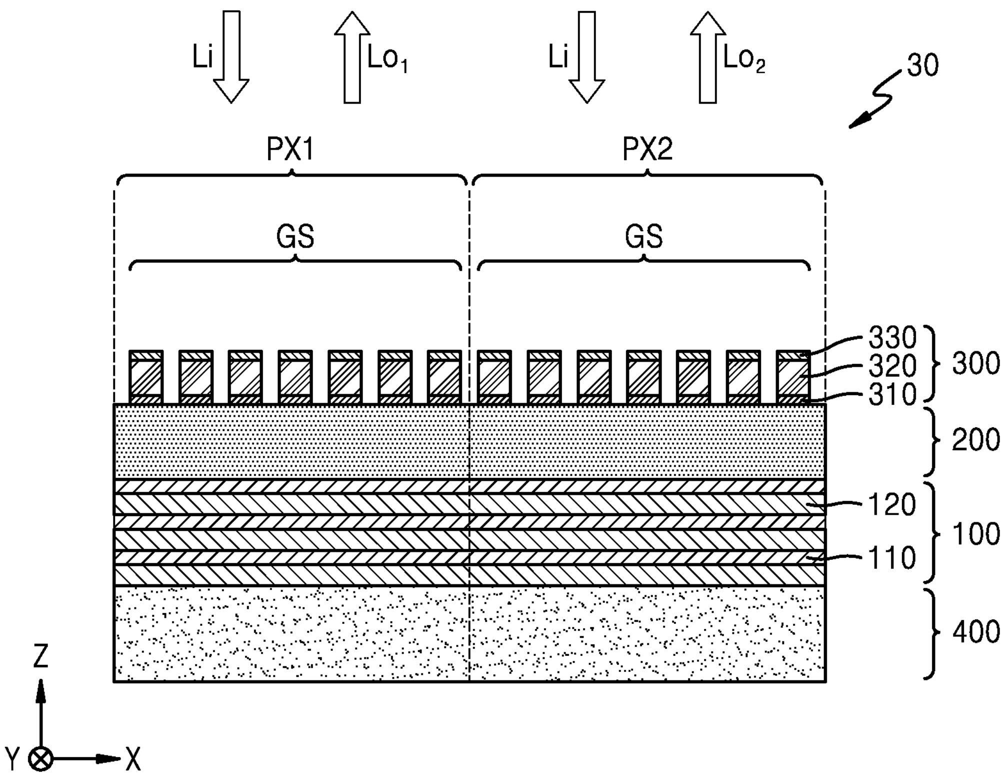
FIG. 3A is a cross-sectional view conceptually illustrating an example of a spatial light modulator applicable to a 3D distance information acquisition system according to an example embodiment.
Figure 3B:
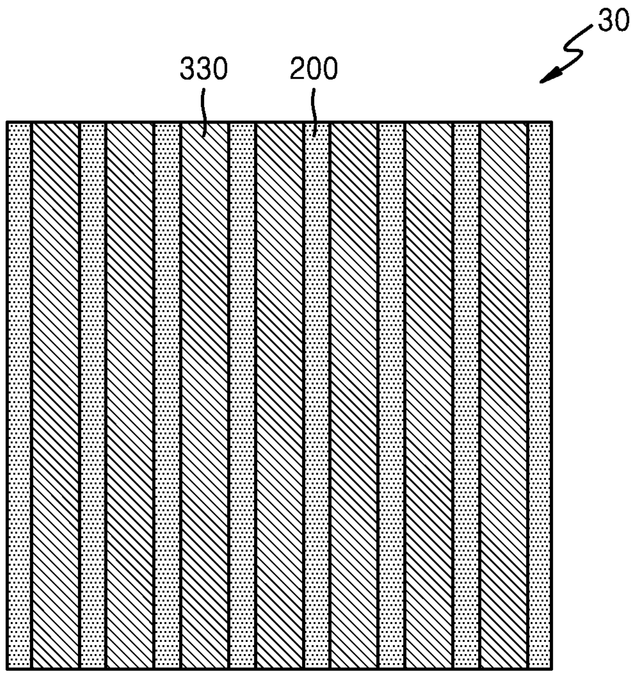
FIG. 3B is a plan view of a pixel of the spatial light modulator of FIG. 3A.

FIG. 3A is a cross-sectional view conceptually illustrating an example of the spatial light modulator 30 applicable to the 3D distance information acquisition system 10 according to an embodiment. FIG. 3B is a plan view of a pixel (i.e., a first PX1 or a second pixel PX2) of the spatial light modulator 30 of FIG. 3A. FIG. 3A illustrates the first pixel PX1 and the second pixel 2 as an example.

With reference to FIGS. 3A and 3B, the spatial light modulator 30 may include a first material layer 100 provided on a substrate 400, a cavity 200 arranged on the first material layer 100, and a second material layer 300 arranged on the cavity layer 200. Referring to FIG. 3A, the second material layer 300 may include a second doped semiconductor layer 330, and as shown in FIG. 3B, the second doped semiconductor layer 330 and the cavity 200 may be alternately arranged in the spatial light modulator 30.

The spatial light modulator 30 may modulate a phase of incident light Li and output the phase-modulated light. The spatial light modulator 30 may include a plurality of pixels for steering incident light by the phase modulation. The plurality of pixels may include, for example, the first pixel PX1 and the second pixel PX2. The pixel may be a minimum unit, which may be independently driven, or a basic unit, which may independently modulate a phase of light, in the spatial light modulator 30. Each pixel may include one or a plurality of grating structures GS forming the second material layer 300. FIG. 3A illustrates an example of a structure including two pixels (i.e., the first pixel PX1 and the second pixel PX2). The spatial light modulator 30 may have a structure in which the pixels are arranged in a one-dimensional or two-dimensional manner. FIG. 3A illustrates that each pixel (i.e., each of the first pixel PX1 and the second pixel PX2) includes seven grating structures GS; however, such description is merely an example, and the embodiment is not limited thereto. A pitch between the grating structures GS may be less than a wavelength of light to be modulated. A length of one side of the first and second pixels PX1 and PX2 may be, for example, about 3 μm to about 300 μm.

As such, the spatial light modulator 30 may be a one-dimensional or two-dimensional array of a plurality of pixels for steering incident light by phase modulation, and each pixel may include a stacked structure of a first material layer 100, a cavity 200, and a second material layer 300.

In addition, the spatial light modulator 30 may further include the substrate 400 supporting the first material layer 100. The substrate 400 may include an insulating material. For example, the substrate 400 may be a transparent substrate transmitting light (e.g., a glass substrate) or a semiconductor substrate (e.g., a silicon substrate). In addition to the foregoing, the substrate 400 may include substrates including various other types of materials.

The first material layer 100 may be a distributed Bragg reflector. For example, the first material layer 100 may include a first layer 110 and a second layer 120, which have different refractive indexes. The first layer 110 and the second layer 120 may alternately stacked. Due to a refractive index difference between the first layer 110 and the second layer 120, light may be reflected from an interface of each layer, and the reflected light may cause interference. The first layer 110 or the second layer 120 may include silicon (Si), silicon nitride ($Si_3N_4$), silicon oxide ($SiO_2$), titanium oxide ($TiO_2$), etc. For example, the first layer 110 may include silicon (Si), and the second layer 120 may include silicon oxide ($SiO_2$). A thickness and/or a stacking number of the first layer 110 and the second layer 120, a light reflectivity of the first layer 110 may be adjusted to achieve a desired modulation performance.

The first material layer 100 may be a structure other than a distributed Bragg reflector, and for example, may include a metal material layer having one surface that is metal.

The cavity layer 200 may be a region in which resonance of incident light occurs, and may be arranged between the first material layer 100 and the second material layer 300.

The cavity layer 200 may include, for example, silicon oxide ($SiO_2$). A resonant wavelength may be determined according to a thickness of the cavity layer 200. The greater the thickness of the cavity layer 200 is, the longer the resonant wavelength of the light may be, and the less the thickness of the cavity layer 200 is, the shorter the resonant wavelength of the light may be.

The second material layer 300 may be configured to perform a reflection function to reflect light of a particular wavelength, and a phase modulation function to modulate a phase of emitted light.

The second material layer 300 may include a plurality of grating structures GS spaced apart from each other at a certain distance. A thickness, a width, and a pitch of the grating structure GS may be less than a wavelength of light modulated by the spatial light modulator 30. The reflectivity of modulated light may be increased by adjusting the thickness, width, and pitch of the grating structure GS. The reflectivity of the second material layer 300 may be different from that of the first material layer 100. The reflectivity of the second material layer 300 may be less than that of the first material layer 100.

The spatial light modulator 30 may be a reflective spatial light modulator or a transmissive spatial light modulator. FIG. 3A illustrates an example in which the spatial light modulator 30 is a reflective type. Hereinafter, the case where the spatial light modulator 30 is a reflective spatial light modulator is exemplarily described. The spatial light modulator 30 may also be provided as a transmissive type.

The light Li incident onto the spatial light modulator 30 may pass through the second material layer 300 to be propagated to the cavity layer 200. Then, after the light Li may be reflected by the first material layer 100, that is, the distributed Bragg reflector, and be kept in the cavity layer 200 by the first material layer 100 and the second material layer 300, causing resonance thereof, the light Li may be emitted through the second material layer 300. Light $Lo_1$ emitted from the first pixel PX1 (hereinafter, emitting light $Lo_1$) and light emitted Lo2 from the second pixel PX2 (hereinafter, emitting light Lo2) may each have a particular phase, and phases of the emitting light $Lo_1$ and the emitting light Lo2 may be controlled by a refractive index of the second material layer 300. A proceeding direction of light may be determined by a phase relationship of light emitted from adjacent pixels. For example, when the phase of the emitting light $Lo_1$ of the first pixel PX1 is different from that of the emitting light $Lo_2$ of the second pixel PX2, the proceeding direction of light may be determined by interaction between the emitting light $Lo_1$ and the emitting light $Lo_2$.

Figure 4A:
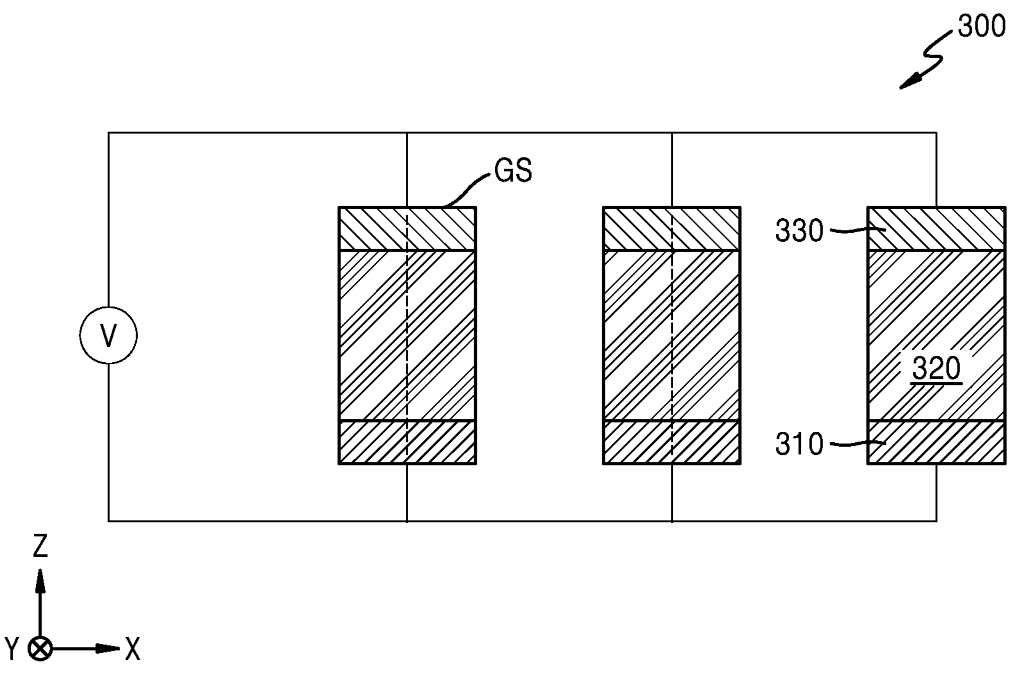
FIG. 4A is a cross-sectional view of a grating structure included in the pixel of FIG. 3A.
Figure 4B:
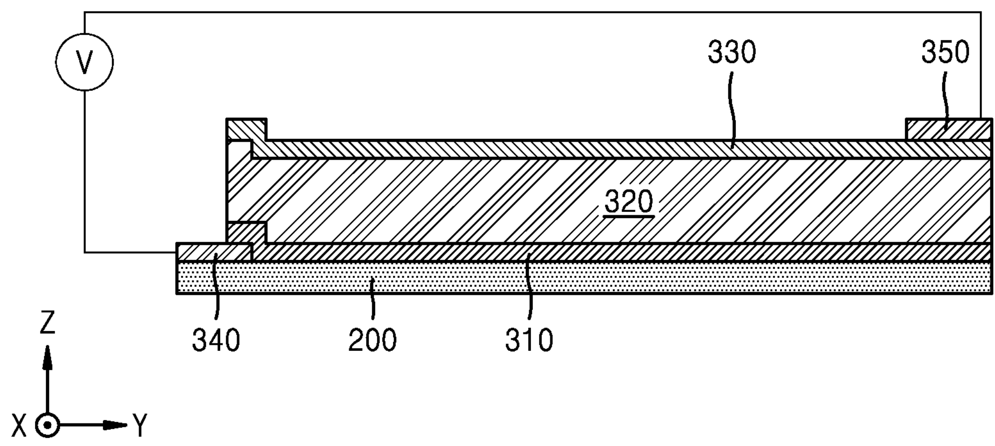
FIG. 4B is a cross-sectional view of the grating structure seen from another direction.

FIG. 4A is a cross-sectional view of a grating structure GS included in the pixels PX1 and PX2 of FIG. 3A, and FIG. 4B is a cross-sectional view of the grating structure GS seen from another direction.

With reference to FIG. 4A, the grating structure GS may include a first doped semiconductor layer 310, an intrinsic semiconductor layer 320, and a second doped semiconductor layer 330. For example, the first doped semiconductor layer 310 may be an n-type semiconductor layer, the second doped semiconductor layer 330 may be a p-type semiconductor layer, and the grating structure GS may be a positive-intrinsic-negative (PIN) diode.

The first doped semiconductor layer 310 may be a silicon (Si) layer including as impurities group 5 elements, for example, phosphorus (P) or arsenic (As). The concentration of the impurity in the first doped semiconductor layer 310 may be about $10^{15}$ $cm^{-3}$ to about $10^{21}$ $cm^{-3}$. The intrinsic semiconductor layer 320 may be, for example, a silicon (Si) layer not including impurities. The second doped semiconductor layer 330 may be a silicon (Si) layer including as impurities group 3 elements, for example, boron (B). The concentration of the impurity in the second doped semiconductor layer 330 may be about $10^{15}$ $cm^{-3}$ to about $10^{21}$ $cm^{-3}$.

When a voltage is applied between the first doped semiconductor layer 310 and the second doped semiconductor layer 330, a current may flow from the first doped semiconductor layer 310 towards the second doped semiconductor layer 330, heat is generated at the grating structure GS due to the current, and a refractive index of the grating structure GS may be changed by the heat. When the refractive index of the grating structure GS is changed, the phases of light emitted from the first pixel PX1 and the second pixel PX2 may be changed, and thus, by adjusting a level of voltage applied to the first pixel PX1 and the second pixel PX2, the proceeding direction of light emitted from the spatial light modulator 30 may be controlled.

FIG. 4B is a cross-sectional view of a grating structure GS seen from another direction. With reference to FIG. 4B, the spatial light modulator 30 may include a first electrode 340, and a second electrode 350 to apply a voltage to the grating structure GS. The first electrode 340 may be in contact with one end of the first doped semiconductor layer 310, and the second electrode 350 may be in contact with one end of the second doped semiconductor layer 330. The second electrode 350 may be in contact with an end portion disposed opposite to an end portion contacted by the first electrode 340 in a Y direction. The first electrode 340 may be disposed on the cavity layer 200, and may be a common electrode applying a common voltage to all pixels included in the spatial light modulator 30. The second electrode 350 may be a pixel electrode configured to apply different voltages to the pixels.

Although FIGS. 4A and 4B illustrate the grating structure GS having a PIN structure, the present disclosure is not limited thereto. The grating structure GS may have a negative-intrinsic-negative (NIN) structure or a positive-intrinsic-positive (PIP) structure. For example, the first and second doped semiconductor layers 310 and 330 may be an n-type semiconductor layer or a p-type semiconductor layer.

The grating structure GS of the spatial light modulator 30 according to an embodiment may be based on silicon. A refractive index of silicon may be proportional to temperature. The greater a change in temperature of silicon is, the greater a change in the refractive index of silicon may be. As the change in the refractive index of silicon is directly proportional to the temperature change, the refractive index may be easily adjusted by adjusting the temperature change. Accordingly, the refractive index of the grating structure GS may be easily adjusted by controlling an electrical signal applied to silicon.

The spatial light modulator 30 according to an embodiment may be provided so that the refractive index of the grating structure GS is changed by external electric stimulation, thereby controlling resonance conditions to modulate a phase, and may be driven according to a phase profile provided from the controller 70 for steering light in various directions. The phase profile may be a binary electrical signal of which on signal or off signal is applied for each pixel.

As in the spatial light modulator 30 described with reference to FIGS. 3A, 3B, 4A, and 4B, when a light wave is incident onto a resonance structure capable of storing a light wave, a phase reflected or transmitted due to resonance may be drastically changed. When a voltage is applied to the resonance structure, a refractive index of a material constituting a resonator may be changed, and thus, a phase reflected or transmitted with respect to a light wave of a determined wavelength may be changed as well.

When the phase modulation elements are made into a one-dimensional or two-dimensional array, and different voltages are applied to each unit pixel constituting each array to have different phases, a reflection or transmission angle of the light wave incident from the outside may be changed in a particular direction according to input voltage distribution, and the beam steering may be performed. As such, beam steering method does not involve any mechanical movement, unlike using a rotating mirror in a mechanical manner or MEMS, etc., and makes solid-state driving possible, it may have the merit of withstanding a strong external impact or vibration.

According to the 3D distance information acquisition system 10 of an embodiment, as the beam steering is performed in a non-mechanical manner by the spatial light modulator 30 capable of performing solid-state driving, the 3D distance information acquisition system 10 may endure a strong external impact or vibration.

Figure 5:
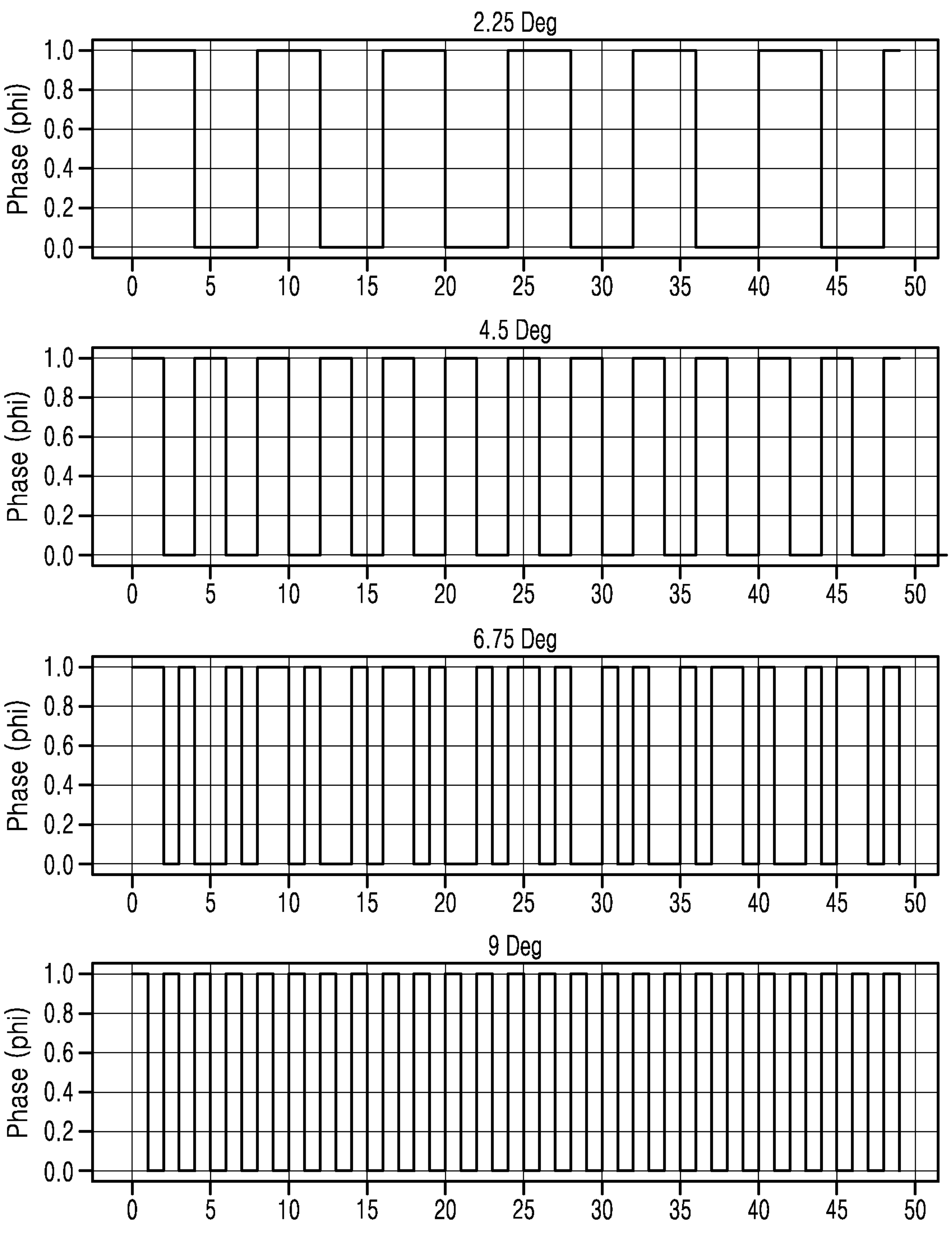
FIG. 5 is a diagram illustrating an example of a phase profile applied to a spatial light modulator according to an example embodiment.

FIG. 5 is a diagram illustrating an example of a phase profile applied to the spatial light modulator 30 according to an embodiment. As illustrated in FIG. 5, the greater a steering angle by the spatial light modulator 30 including 50 pixels is, the less a duty cycle of a phase profile may become. The controller 70 may provide an on signal or an off signal to each pixel according to a phase profile corresponding to a steering angle.

The on signal may be applied to any one of pixels adjacent of the spatial light modulator 30, and the off signal may be applied to the other one.

FIG. 6A illustrates an example of an optical configuration of the transmitter 20 applied to the 3D distance information acquisition system 10 according to an embodiment, and FIG. 6B illustrates another example of an optical configuration of the transmitter 20 applied to the 3D distance information acquisition system 10 according to an embodiment. FIGS. 6A and 6B illustrate an example in which the transmitter 20 includes a reflective spatial light modulator as the spatial light modulator 30; however, the embodiment is not limited thereto. Moreover, FIGS. 6A and 6B illustrate one pixel structure of the spatial light modulator 30; however, the spatial light modulator 30 may have a one-dimensional or two-dimensional array of a plurality of pixels.

With reference to FIGS. 6A and 6B, the transmitter 20 may include the pulse light source 21 and the spatial light modulator 30. The transmitter 20 may include as the light source optical system 23, for example, the collimating lens 23*a* collimating light emitted from the pulse light source 21. Moreover, the transmitter 20 may include as the outgoing optical system 25, the diverging lens 25*a* expanding a range of beam steering by the spatial light modulator 30.

The pulse light source 21 may be provided to emit light of which the central wavelength is within visible range or a near-infrared range and may be driven to output pulse light. The pulse light source 21 may include at least one semiconductor laser, for example, a plurality of semiconductor laser arrays to output pulse light of desired power. The pulse light source 21 may turn on or off all or some of the plurality of semiconductor laser arrays, to output a pulse light having desired power. The semiconductor layer applied as the pulse light source 21 may include any one of an EEL, a VCSEL, and a PCSEL.

As such, the pulse light source 21 may include at least one semiconductor laser, which may be used as a flash semiconductor light source to output pulse light of desired power. For example, the pulse light source 21 may include a plurality of VCSEL arrays, and may be used as a flash VCSEL light source to output pulse light of desired power.

The semiconductor laser constituting the pulse light source 21 may generate a pulse beam having a pulse width of, for example, several to several tens of nanoseconds in an input of an external electrical signal as a pulse, and a rise time may be several tens of picoseconds to several nanoseconds.

The pulse light emitted from the pulse light source 21 may be collimated by the collimating lens 23*a* and then be incident onto the spatial light modulator 30.

The transmitter 20 may include, a reflective spatial light modulator as the spatial light modulator 30, and when a direction in which the light emitted from the pulse light source 21 proceeds towards the spatial light modulator 30 is a first proceeding direction, and a direction in which light steered by the spatial light modulator 30 proceeds is a second proceeding direction, the transmitter 20 may have an optical configuration such that the first proceeding direction and the second proceeding direction are different from each other.

The spatial light modulator 30 may be disposed to be inclined with respect to a plane formed by the first proceeding direction and the second proceeding direction, as illustrated in FIG. 6A. For example, the spatial light modulator 30 may be disposed at an inclination angle of about 45° or other.

Furthermore, as illustrated in FIG. 6B, the spatial light modulator 30 may be disposed to be perpendicular to a plane formed in the first proceeding direction and the second proceeding direction, and the transmitter 20 may further include an inclined mirror member 27 for reflecting light steered by the spatial light modulator 30 in a direction out of the plane formed by the first proceeding direction and the second proceeding direction. For example, the spatial light modulator 30 may be installed at about 90°, and the mirror member 27 capable of reflecting light at about 45° or other inclinations may be used.

As for the beam steering by the phase modulation array of the spatial light modulator 30, a range of a maximum bendable angle may be given by the following Equation 1.

$$\theta = \sin^{-1}\left(\frac{\lambda_0}{2P\cos\phi}\right) \quad \text{Equation 1}$$

$\lambda_0$ represents a wavelength of a light wave in a vacuum, P represents a pixel period of a phase modulation array of the spatial light modulator 30, and $\phi$ represents an incident angle. For example, when the wavelength is about 940 nm, the period is about 5 μm, and the incident angle is about 45° with respect to horizontal direction, an angle range in the horizontal direction may be $|\theta| \leq 7.6°$, and an angle range in the vertical direction may be $|\theta| \leq 5.4°$, so the beam steering range may be limited.

Such beam steering range may be expanded by using the diverging lens 25*a* such as a concave lens at the outgoing optical system 25, as illustrated in FIGS. 6A and 6B. For example, when using a lens capable of diverging light in horizontally and vertically×4 times as the diverging lens 25*a*, a range of about ±30.6° (all-angle of about 61.2°) in the horizontal direction and a range of about ±21.6° (all-angle of about 43.2°) in the vertical direction may be scanned.

As illustrated in FIGS. 6A and 6B, when using the spatial light modulator 30 operating as a beam steering device based on a reflective phase modulation array, the beam steering may be implemented in a folded optic structure. The spatial light modulator 30 may form an angle of about 45° with a bottom of a device, as illustrated in FIG. 6A, but the inclination angle between the spatial light modulator 30 and the device bottom is not limited thereto. Moreover, the spatial light modulator 30 may be installed to form an angle of about 90° with a bottom of a device, as illustrated in FIG. 6B, and the mirror member 27 may form an inclination angle of about 45° or other with the bottom device.

Figure 7:
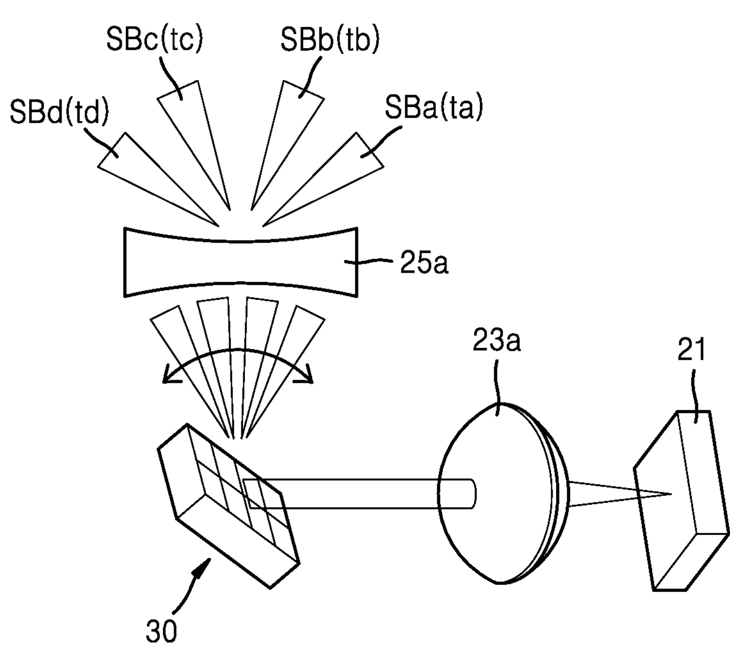
FIG. 7 is a diagram illustrating beam steering in a transmitter of a 3D distance information acquisition system according to an example embodiment.

FIG. 7 is a diagram illustrating beam steering in the transmitter 20 of the 3D distance information acquisition system 30 according to an embodiment. FIG. 7 illustrates an example in which the spatial light modulator 30 includes a two-dimensional array of a plurality pixels, and the diverging lens 25*a* is a concave lens; however, instead of this, the diverging lens 25*b*, which is a concave cylinder lens, may be applied to expand the beam steering range, as illustrated in FIGS. 8A and 8B.

With reference to FIG. 7, the pulse light emitted from the pulse light source 21 may be collimated by the collimating lens 23*a*, and may be incident onto the spatial light modulator 30. The pulse light incident onto the spatial light modulator 30 may be steered by the spatial light modulator 30. SBa, SBb, SBc, and SBd in FIG. 7 represent beams steered by the spatial light modulator 30.

As the light emitted from the pulse light source 21 is pulse light and the spatial light modulator 30 modulates a phase of incident pulse light to adjust a proceeding direction of light to a desired direction, the beams SBa, SBb, SBc, and SBd steered by the spatial light modulator 30 may be generated time-sequentially clockwise or counterclockwise. That is, the output times of the beams (SBa, SBb, SBc, and SBd) may be different from one another. Moreover, as illustrated in FIG. 7, the steering range of the beams SBa, SBb, SBc, and SBd steered by the spatial light modulator 30 may be expanded by the diverging lens 25*a*.

The 3D distance information acquisition system 10 according to the embodiment may steer the light emitted from the pulse light source 21 in a one-dimensional or two-dimensional manner to obtain 3D distance information. For example, when different voltages are applied to each unit pixel constituting each arrangement of the spatial light modulator 30 so that they have different phases to make the phase modulation elements of the spatial light modulator 30 in a one-dimensional or two-dimensional array, the light emitted from the pulse light source 21 may be steered in a one-dimensional manner. Furthermore, when different voltages are applied to each unit pixel constituting each arrangement of the spatial light modulator 30 so that they have different phases to make the phase modulation elements of the spatial light modulator 30 in a two-dimensional array, the light emitted from the pulse light source 21 may be steered in a two-dimensional manner.

When the 3D distance information acquisition system 10 according to an embodiment is implemented to steer light emitted from the pulse light source 21 in a one-dimensional manner, the diverging lens 25*b*, which is a cylinder lens, may be applied to the outgoing optical system 25, as illustrated in FIGS. 8A and 8B.

FIGS. 8A and 8B illustrate examples in which the diverging lens 25*b*, which is a cylinder lens, is included in the outgoing optical system 25 of the 3D distance information acquisition system 10 according to an embodiment, where the examples respectively have optical configurations corresponding to FIGS. 6A and 6B, and differ in that a cylinder lens is provided as the diverging lens 25*b* for expanding the beam steering range.

With reference to FIGS. 8A and 8B, a cylinder lens having one concave lens surface or both concave lens surfaces may be provided as the diverging lens 25*b*. FIGS. 8A and 8B illustrate an example in which the diverging lens 25*b* includes a cylinder lens with both lens surfaces that are concave.

Figure 9A:
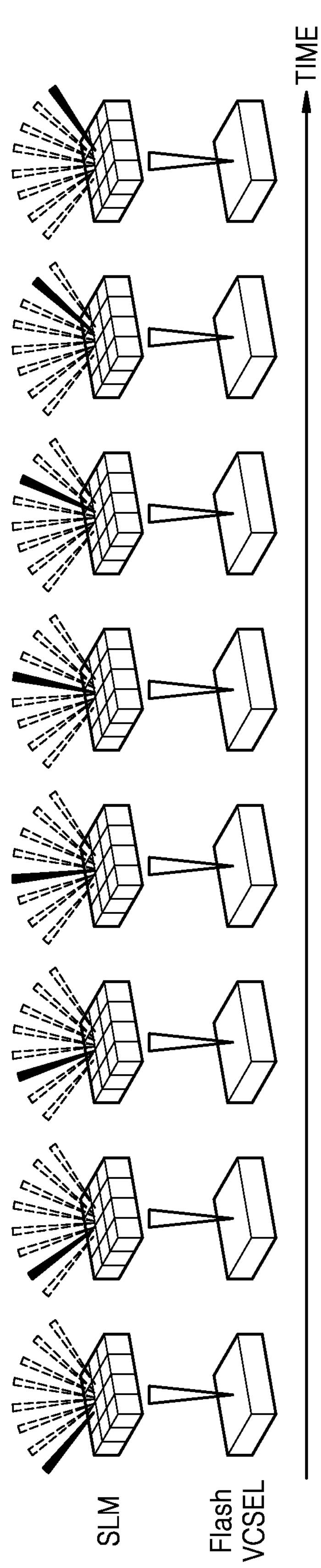
FIG. 9A is a diagram illustrating time sequential beam steering in a transmitter of a 3D distance information acquisition system according to an example embodiment.
Figure 9B:
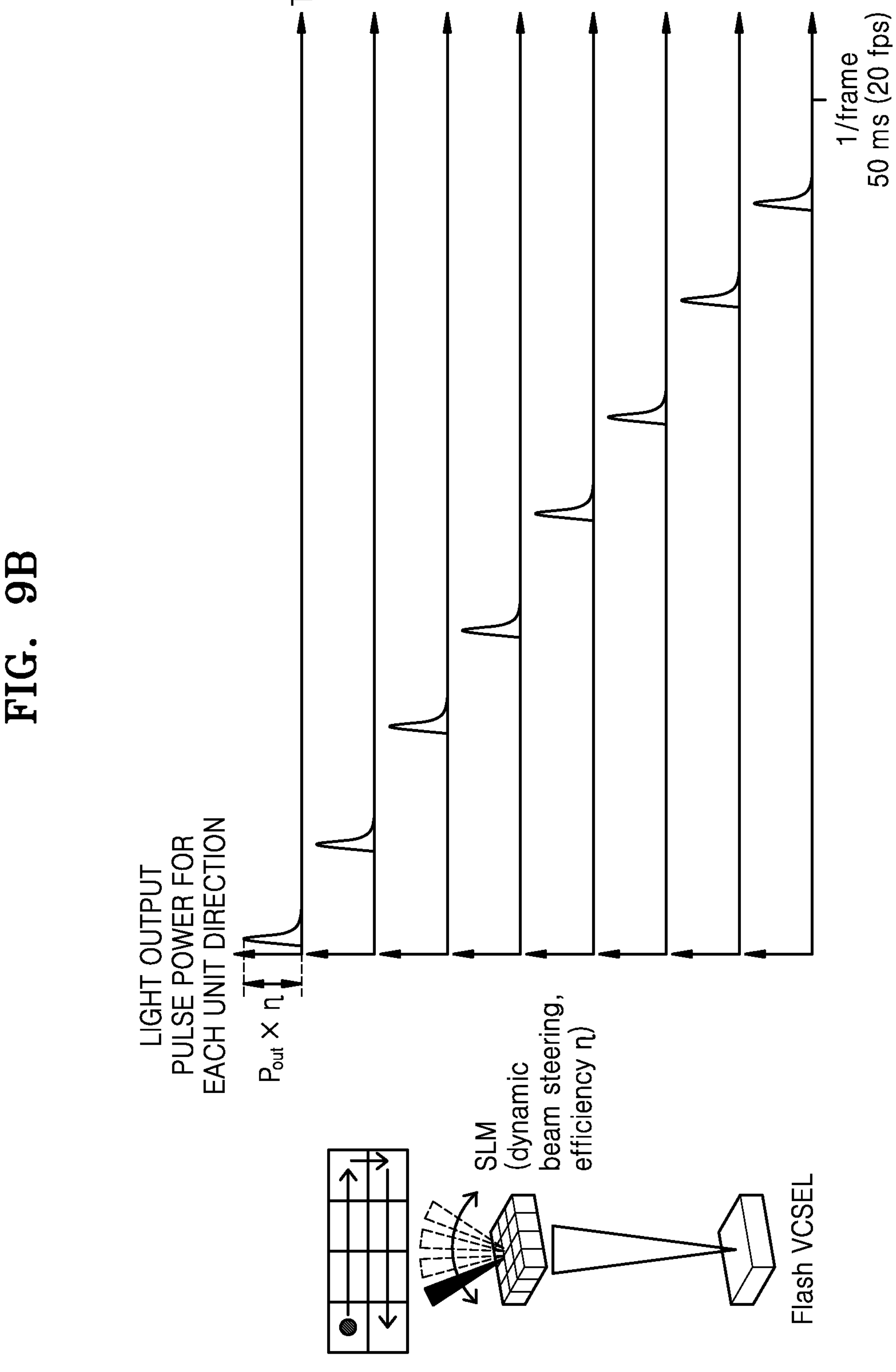
FIG. 9B is a diagram illustrating pulse power for each unit direction of light emitted time-sequentially from a transmitter of a 3D distance information acquisition system according to an example embodiment.

FIG. 9A illustrates time-sequential beam steering at the transmitter 20 of the 3D distance information acquisition system 10 according to an embodiment, and FIG. 9B illustrates pulse power for each unit direction of time-sequentially emitted light at the transmitter 20 of the 3D distance information acquisition system 10 according to an embodiment.

SLMs in FIGS. 9A and 9B may correspond to the spatial light modulator 30 according to an embodiment, which performs beam steering of a phase modulation array substrate according to an embodiment. FIGS. 9A and 9B illustrate that the SLM is a transmissive-type spatial light modulator; however, such description is provided only for convenience, and is not intended to limit the SLM to a transmissive SLM. The SLM may be a reflective type. Furthermore, the transmitter 20 of FIGS. 9A and 9B may include or not include at least one of the collimating lens 23*a* and the diverging lens 25*a*. Moreover, FIGS. 9A and 9B illustrate an example in which a flash VCSEL is applied as the pulse light source 21; however, other types of light sources emitting pulse light (flash light) may also be applicable.

With reference to FIGS. 9A and 9B, by applying, for example, a flash VCSEL as the pulse light source 21, pulse light may be output. The flash VCSEL may include a plurality of VCSELs, and turn on/off all VCSELs at once to output flash light, i.e., pulse light. The flash VCSEL may not turn on/off an individual VCSEL; however, in terms of VCSEL manufacturing, as a fill factor is high and a yield is high due to a low level of a required fair-quality for the entire light sources, the price of an applied light source may be low.

According to the 3D distance information acquisition system 10 of an embodiment, as the beam steering is performed through time division by applying the SLM, even when the pulse light source 21 includes a plurality of VCSELs, all the VCSELs may be turned on/off without turning on/off individual VCSELs, and thus, the flash VCSEL may be applied as the pulse light source 21.

For example, one collimated pencil beam may be output from the flash VCSEL. Afterwards, the direction of the pulse beam may be steered by spatial light modulation (SLM). As illustrated in FIGS. 9A and 9B, the entire area of the flash VCSEL may be turned on for eight unit times, and thus, high peak power may be obtained.

With reference to FIG. 9A, according to the 3D distance information acquisition system 10 of an embodiment, as the beam steering is performed by using the SLM, no addressable VCSEL is required, and a flash VCSEL of which all the light sources constituting the flash VCSEL operate altogether may be used. Accordingly, without the need to divide the flash VCSEL into a group of the VCSELs turning on the pulse light source 21 and a group of the VCSELs turning off the pulse light source 21, as the entire area of the flash VCSEL are turned on for unit time, high peak power may be obtained. When the transmissivity or reflectivity of the SLM is less than 100% and a ratio of the intensity of steered light to the intensity of light incident onto the SLM is η, the peak power emitted to one scan point may be represented by the following Equation 2.

$$P'_{out,point}=P_{out}\times\eta \quad \text{Equation 2}$$

When output power of the pulse light source 21, e.g., the flash VCSEL, is $P_{out}$=128 mW, and the transmissivity or reflectivity of the spatial light modulator 30 is η=30%, $P'_{out,point}$ may be 38.4 mW.

A time for one frame constituting one screen may be presented by the following Equation 3.

$$t_{frame}=\frac{1s}{L} \quad \text{Equation 3}$$

L may represent the number of frames (screens) in one second.

The number R of multiple pulses, which may be repeated at one point, and peak power may affect a detectable distance.

The detectable distance in a LIDAR based on the direct time-of-flight method may refer to the distance within a range in which pulse light that is emitted from the transmitter 20 hits a target object, returns, and is recognized by the photodetector 51 as a peak.

To be recognized as a peak, the intensity of a signal needs to be great or the noise magnitude may be insignificant. The light pulse emitted from the transmitter 20 may proceed straight to a target object located at a distance R, hit the target object, undergo Lambertian scattering, and then spread out to a IT steradian (sr) space. The receiver 50 arranged at the same position as the transmitter 20 may receive only a part of light uniformly scattering from the target object to the π sr space. When a distance to the target object is R, an area of the photodetector 51 is $A_{rec}$, power coming into the photodetector 51 inside the receiver 50 may be proportional to $A_{rec}/(\pi R^2)$. Accordingly, the power coming into the receiver 50 may be represented by the following Equation 4.

$$P_R=P_T\frac{\sigma}{A_{illum}}\frac{A_{rec}}{\pi R^2}\eta_{atm}^2\eta_{sys}=C_1\times P_T\times\frac{1}{R^2} \quad \text{Equation 4}$$

$P_R$ represents power coming into the photodetector 51, $P_T$ represents power emitted from the transmitter 20, σ represents a cross-section, $A_{illum}$ represents an exposed area of a target object, $\eta_{atm}$ represents an atmospheric transmittance, and $\eta_{sys}$ represents a system optical efficiency. $C_1$ is a constant. When detectable power of the receiver 50 is $P_{R,th}$, under the same noise condition, a detectable distance may be represented by the following Equation 5.

$$R=\frac{C_1}{\sqrt{P_{R,th}}}\sqrt{P_T}=C_2\times\sqrt{P_T} \quad \text{Equation 5}$$

That is, the detectable distance may be proportional to power of the pulse emitted from the transmitter 20 to the power of ½. A signal-to-noise ratio (SNR) may be represented by the following Equation 6.

$$SNR=\frac{P_{signal}}{P_{noise}} \quad \text{Equation 6}$$

The less the noise is, the greater the SNR may be. That is, when the noise is reduced A times, the SNR is increased A times, and with a constant minimum SNR, the intensity of a signal may be allowed to be decreased A times. Assuming that the noise is random white noise, when a random variable therefor is X, the number of repetitions is B, a random variable for the repetitions may be represented by the following Equation 7.

$$\tilde{X}=\frac{\sum_{i=1}^{B}X_i}{B} \quad \text{Equation 7}$$

An average E and a variance Var of the random variable may be represented by the following Equation 8 and Equation 9, respectively.

$$E(\tilde{X})=E\left(\frac{\sum_{i=1}^{B}X_i}{B}\right)=\frac{1}{B}\sum_{i=1}^{B}E(X_i)=\frac{1}{B}[BE(X)]=E(X) \quad \text{Equation 8}$$

$$\text{Var}(\tilde{X})=V\left(\frac{\sum_{i=1}^{B}X_i}{B}\right)=\frac{1}{B^2}\sum_{i=1}^{B}V(X_i)=\frac{1}{B^2}[BVar(X)]=\frac{\text{Var}(X)}{B} \quad \text{Equation 9}$$

Accordingly, with respect to the standard deviation $\tilde{\sigma}$, the intensity of random noise may be reduced by the amount of B to the power of ½. This may be referred to as accumulative noise reduction.

$$\tilde{\sigma}=\frac{\sigma}{\sqrt{B}} \quad \text{Equation 10}$$

When a minimum detectable SNR is $SNR_{th}$, a signal and noise satisfying the foregoing may be represented by the following Equation 11.

$$SNR_{th} = \frac{P_{signal}}{P_{noise}} = \frac{C_1 P_T \frac{1}{R_2}}{P_{noise}} \quad \text{Equation 11}$$

When the noise is reduced $B^{(-1/2)}$ times through repetitions for B times, an increment R may be calculated. Here, the signal and noise may be represented with prime added thereto as follows.

$$SNR_{th} = \frac{P'_{signal}}{P'_{noise}} = \frac{C_1 P_T \frac{1}{R'^2}}{\frac{P_{noise}}{\sqrt{B}}} \quad \text{Equation 12}$$

When dividing Equation 11 by Equation 12, the result may be as follows.

$$1 = \frac{\frac{1}{R^2}}{\frac{\sqrt{B}}{R'^2}} = \frac{R'^2}{R^2\sqrt{B}} \quad \text{Equation 13}$$

$$R' = R\sqrt[4]{B} \quad \text{Equation 14}$$

Accordingly, in the case of repetitions for B times, the detectable distance may be increased $B^{(1/4)}$ times as described below.

Figure 10:
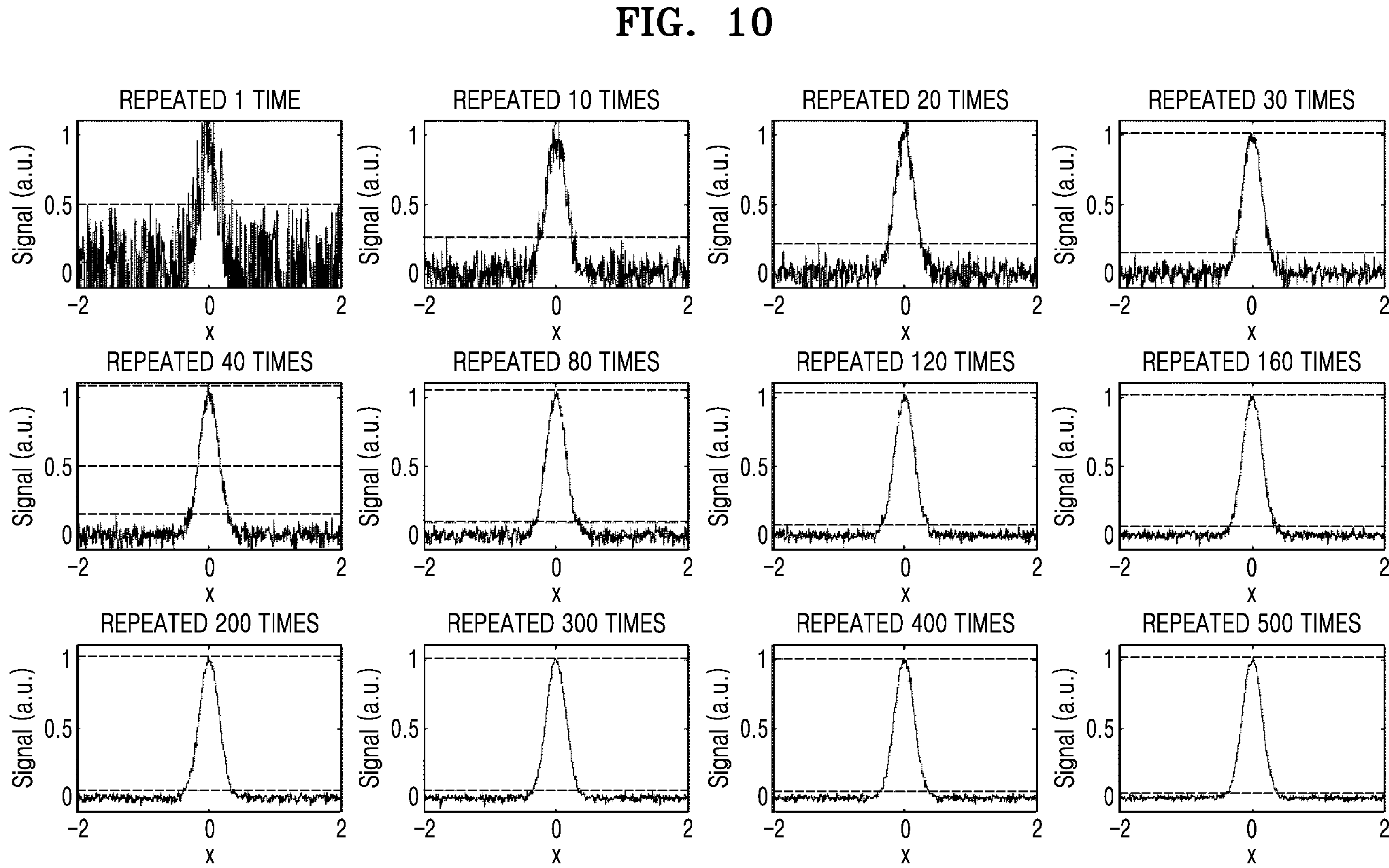
FIG. 10 shows simulation results of effects of random white noise according to various numbers of measurement repetitions.

FIG. 10 shows simulation results of effects of random white noise according to various numbers of measurement repetitions. The greater the number of repetitions is, the less the intensity of noise (magenta) may be.

Figure 11:
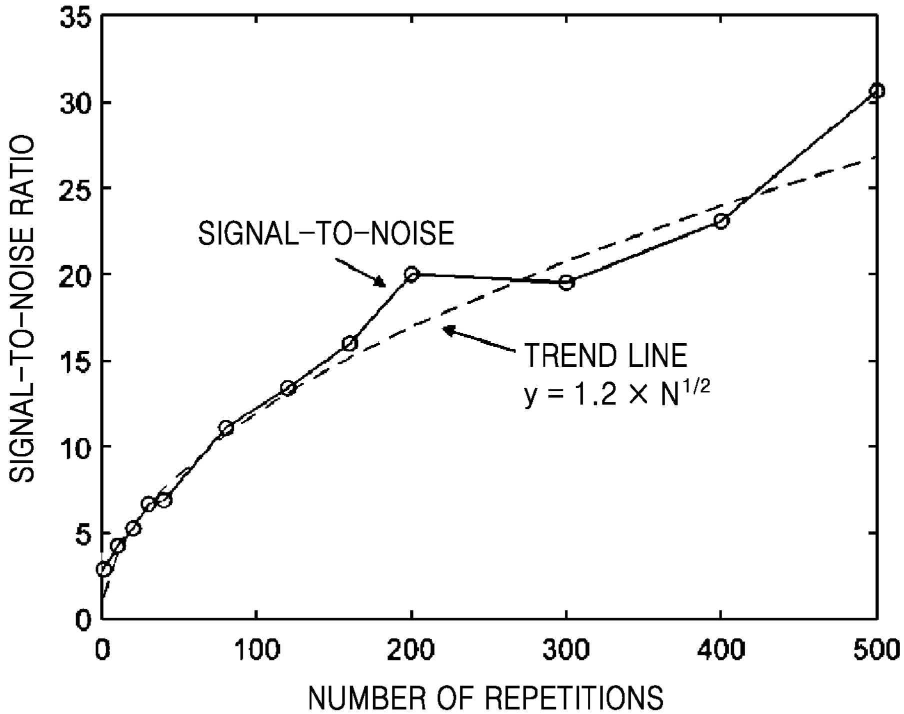
FIG. 11 shows a result of comparison by quantitatively plotting signal-to-noise ratio (SNR) values according to iteration number based on the simulation results of FIG. 10 and adding a trend line thereto.

FIG. 11 shows a result of comparison by quantitatively plotting SNR values according to iteration number based on the simulation results of FIG. 10 and adding a trend line thereto; The SNR may be proportional to the repetition number to the power of ½.

From Equation 5 and Equation 14, it may be understood that the detectable distance is proportional to the peak power per scan point to the power of ½, and also proportional to the multiple pulse (the measurement repetition number B) to the power of ¼. In other words, $$R = C \times \sqrt{P_{out,point}} \times \sqrt[4]{B} \quad \text{Equation 15}$$

C is a proportional constant.

In an embodiment where Equation 2 is applied to Equation 15, the detectable distance may be calculated as follows.

$$C \times \sqrt{P_{out} \times \eta} \times \sqrt[4]{\frac{1s}{L \times M \times N \times K} \cdot \frac{c_0}{2d}} \quad \text{Equation 16}$$

L represents the number of frames in one second, M×N×K represents the number of points constituting one frame, co represents the speed of light, which is about 299,792,458 m/s, and d represents a distance to an object per angle. When $P_{out}$=128 mW, η=30%, L=20, M=4, N=2, K=1, and d=10 m, the result may be C×108.4322.

M×N×K is for comparison with a comparative example, and may correspond to a case where an addressable VCSEL in which one pulse is divided into M pulses by a DOE and sorted into N groups, and K light sources are provided in each group is used.

In a comparative example, when the entire VCSEL is turned on, the peak power coming out from one light source with respect to the peak power Pout of emitted light may be represented by the following Equation 17.

$$P_{out,source} = \frac{P_{out}}{N \times K} \quad \text{Equation 17}$$

As one pulse is equally divided into M pieces by the DOE, the peak power of the pulse beam towards one point may be represented by the following Equation 18.

$$P_{out,point} = \frac{P_{out,source}}{M} = \frac{P_{out}}{M \times N \times K} \quad \text{Equation 18}$$

For example, when $P_{out}$ is 128 mW, M=4, N=2, and K=1, $P_{out,point}$=128/(4×2×1)=16 mW. This means that the peak power arriving at each scan point may be lowered in comparison with the embodiment.

As described above, the number of multiple pulses repeatable at one point and the peak power may affect a detectable distance, and in the case of the comparative example, the number of multi pulses G may be represented by the following Equation 19.

$$G = \frac{1s}{L \times N} \cdot \frac{c_0}{2d} \quad \text{Equation 19}$$

As described above, as the detectable distance is proportional to the peak power per scan point to the power of ½, and also proportional to the multiple pulse (a measurement repetition number) to the power of ¼, the detectable distance in the comparative example may be calculated by the following Equation 20.

$$C \times \sqrt{\frac{P_{out}}{M \times N \times K}} \times \sqrt[4]{\frac{1s}{L \times N} \cdot \frac{c_0}{2d}} \quad \text{Equation 20}$$

When $P_{out}$=128 mW, L=20, M=4, N=2, K=1, and d=10 m, the result may be C×98.9846.

Upon comparing the embodiment to the comparative example under the same condition of $P_{out}$=128 mW, L=20, M=4, N=2, K=1, and d=10 m, it is understood that the detectable distance in the embodiment is C×108.4322, whereas the detectable distance in the comparative example is C×98.9846, which indicates that the detectable distance of the embodiment may be increased more.

The rate of increase I of the detectable distance of the embodiment to the detectable distance of the comparative example may be, for example, I=1.0954 when η=0.3 (30%), N=2, M=4, and K=1, and I=3.7947 when M=9, N=4, K=16, which shows that the detectable distance may be increased 3.8 times.

As in the embodiment, as the detectable distance may be proportional to the output optical power of the pulse light source 21 to the power of ½, and proportional to the measurement number to the power of ¼, when the M, N, K times division is performed through time division by beam steering using the spatial light modulator 30 instead of spatial division, the optical power arriving at each scan point may be increased, and the detectable distance may also increase.

For such an increase in detectable distance, the spatial light modulator 30 may meet the following condition. The switching of the spatial light modulator 30 is required to be fast, and the efficiency n of the spatial light modulator 30 needs to be high, for example, about 30%.

Figure 12:
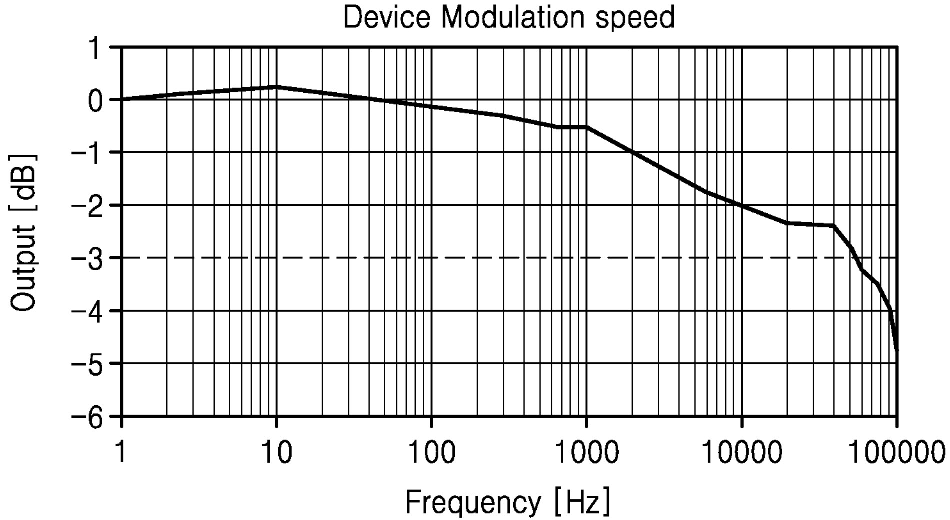
FIG. 12 illustrates operation speed (modulation speed) of a spatial light modulator.

FIG. 12 illustrates operation speed (modulation speed) of the spatial light modulator 30. The horizontal axis represents frequency in a log scale. The vertical axis represents a ratio of output signal amplitude to input signal amplitude. The higher an operating frequency of the spatial light modulator 30 is, the more the aforementioned ratio is reduced, and a frequency at −3 dB may be a cutoff frequency. The cutoff frequency at −3 dB may be about 50 KHz, and this means that the time $T_{10\text{-}90}$ required for the switching state of the spatial light modulator 30 to change to about 90% from about 10% may be about 8.5 μs.

Figure 13:
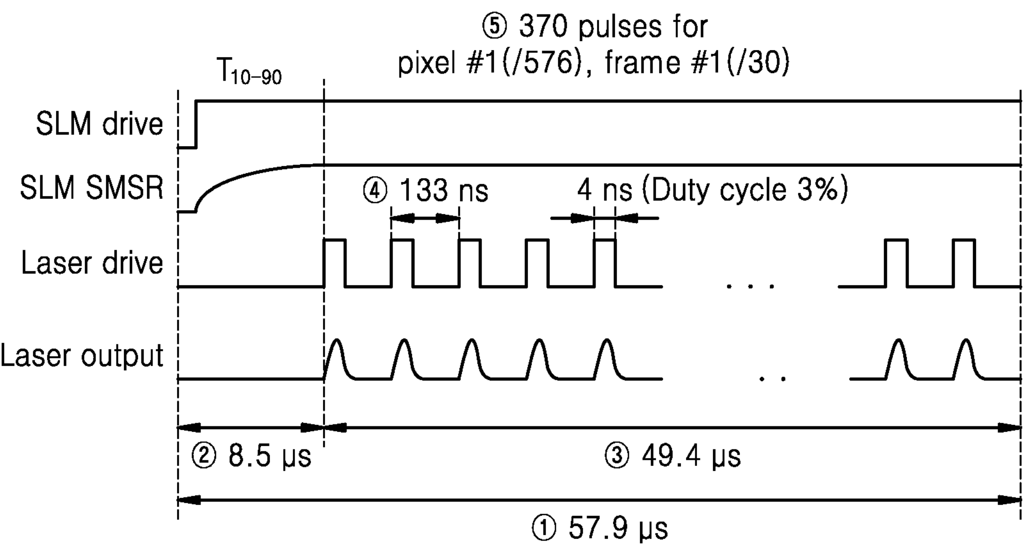
FIG. 13 is a timing diagram illustrating operations of a spatial light modulator over time.

FIG. 13 is a timing diagram illustrating operations of the spatial light modulator 30 over time.

With reference to FIG. 13, to scan 24 points in horizontal direction and 24 points in vertical direction with the speed of 30 frames per one second, the dwell time allowed to one scan point may be about ①57.9 μs. When subtracting $T_{10\text{-}90}$ described above with reference to FIG. 12, which is ②8.5 μs, from ①57.9 μs, the result may be ③49.4 μs. When d=20 m, and a voltage is applied to the SLM, $t_{scan}$ may become ④133 ns. Accordingly, when dividing ③ by ④, the multi pulse number may be ⑤370. By driving in this manner, a high detectable distance may be secured for 30 frames and 24×24 resolution.

Figure 14A:
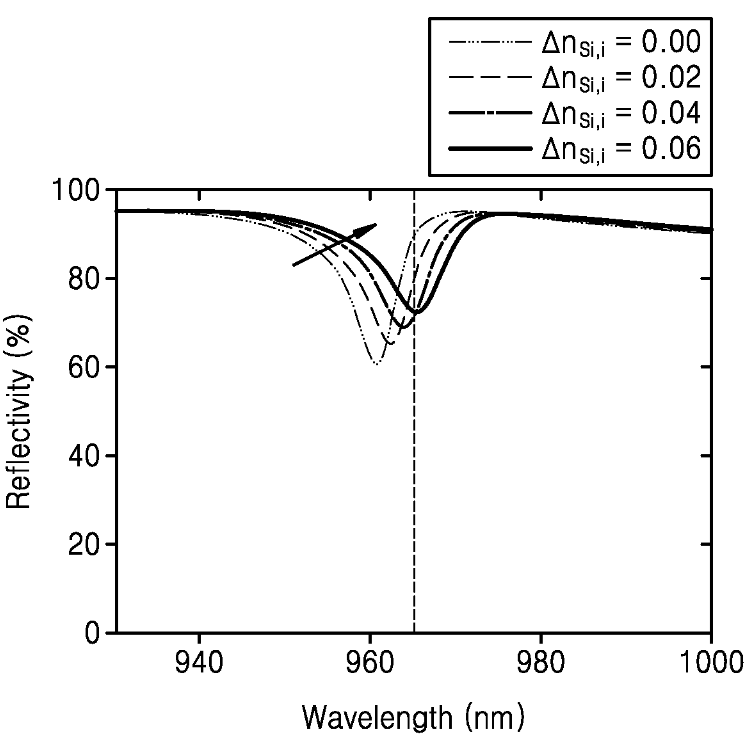
FIG. 14A shows a reflectivity spectrum of a spatial light modulator according to a refractive index change value ($\Delta n_{si,i}$) of a grating structure.
Figure 14B:
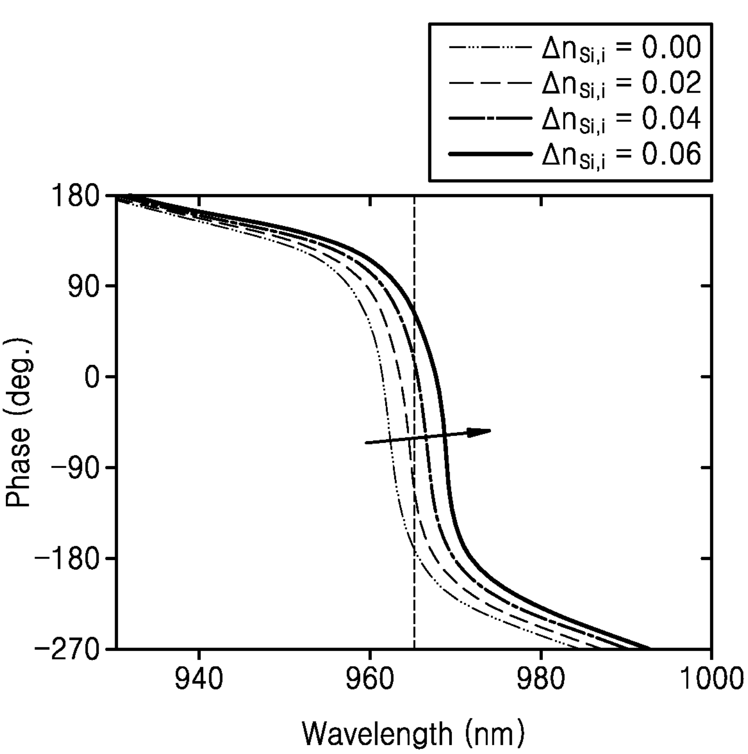
FIG. 14B shows a phase spectrum of a spatial light modulator.
Figure 14C:
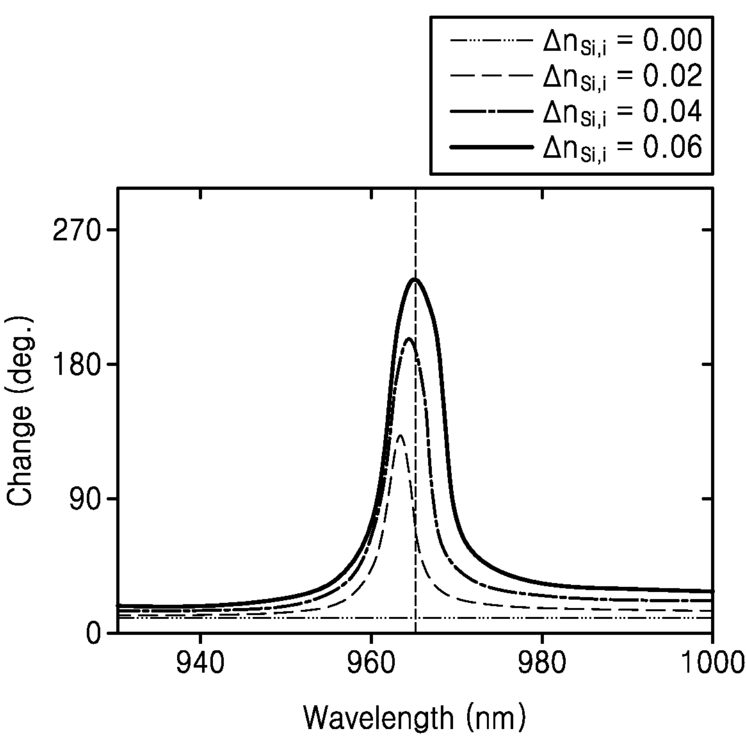
FIG. 14C shows a phase change of a spatial light modulator in comparison with a reference state ($\Delta n_{si,i}=0$)

FIG. 14A shows a reflectance spectrum of the spatial light modulator 30 having the structure of FIG. 3A with a grating structure (a high contrast grating (HCG)) including Si and having a thickness of 500 nm, a period of 580 nm and a width 370 nm, a cavity including $SiO_2$ and having a thickness of 720 nm, and a DBR including six $Si/SiO_2$ layers according to a refractive index change value ($\Delta n_{si,i}$) of the grating structure. It is understood that the reflectance level is about 80% at about 965 nm. FIG. 14B shows a phase spectrum which is in an over-coupling region. FIG. 14C shows a phase change in comparison with a reference state ($\Delta n_{si,i}=0$), and it is understood from FIG. 14C that a phase change of about 230° is possible. Based on the foregoing, when binary phase grating (BPG) is performed alternately between the phases of 0° and 180°, by multiplying the BPG efficiency of 0.4, i.e., 80%×0.4=32%, η=30% may be secured.

In the structure of the comparative example in which the DOE and the addressable VCSEL are used, as M×K points are scanned at the same time, the photodetector may need to have a two-dimensional array having at least M×K resolutions, i.e., capable of separating and detecting each of the pixel signals. To be used as a distance sensor, a high voltage is applied so that each pixel of the photodetector is operated highly sensitively, and to have a high resolution with a two-dimensional array capable of separating and detecting each of pixel signals of pixels to which a high voltage is applied, complex designs and processes may be required, and the price of APD array or SPAD array manufactured based on the foregoing may be high.

On the contrary, according to the 3D distance information acquisition system 10 of an embodiment, as one point is scanned at the same time, and the system recognizes that detected returning light wave during measurement is a signal coming from the corresponding direction, there is no need to separately detect each pixel signal, and it is possible to manufactured in the form of SiPM, so that an inexpensive photodetector may be applied. Moreover, according to an embodiment, when steering pulse beam in one-dimensional line or array in one direction, as the photodetector 51 may only require the function of separately detecting pixel signals of arrays in another direction perpendicular to the foregoing direction, configuration of a readout integrated circuit (ROIC) may become simple.

As in the 3D distance information acquisition system 10 according to an embodiment, when the beam steering is performed by a phase modulation array using the spatial light modulator 30, there is no need to turn on/off individual light sources, and the time-multiplexing method may be used to adjust an emission angle of pulse light over time through the beam steering in the spatial light modulator 30. When a beam steering angle range of the spatial light modulator 30 is limited, the angle range may be expanded by using the diverging lens 25*a* having at least one concave lens surface. In this case, the beam divergence also increases, but may fall within an acceptable range.

For example, as described above, when a diverging lens capable of divergence ×4 times is applied to the 3D distance information acquisition system 10 according to an embodiment, the beam steering range is expanded four times in both horizontal and vertical direction, and thus, the range of about ±30.6° (all-angle of about) 61.2°) in the horizontal direction and the range of about ±21.6° (all-angle of about 43.2°) in the vertical direction may be scanned. In this case, the expanded beam divergence may be represented as follows.

$$\Psi_{FWHM} = \frac{50.764\lambda_0}{NP} \qquad \text{Equation 21}$$

When a horizontal beam divergence value is given to be about 0.068° in a 45° oblique incidence, and an ×4 times diverging lens is applied, beam divergence of about 0.27° may result. Moreover, when a vertical beam divergence value is given to be 0.048° and an ×4 times diverging lens is applied, beam divergence of about 0.19° may be caused. As such, even when the diverging lens 25*a* expanding the beam steering range at a certain ratio is used, the beam divergence may be within a range from about 0.19° to about 0.27°, so it may be designed at a level that does not have any significant limitation in various applications.

As described above, the 3D distance information acquisition system 10 according to an embodiment, uses the spatial light modulator 30 operating as a beam steering element based on a phase modulation array for forming a 3D depth map by measuring a distance based on the time-of-flight method with respect to the plurality of points, and the spatial light modulator 30 may collect light emitted from each light source at one point and scan for individual scan points by the time division method, so a peak power may be high. The detectable distance may be proportional to the peak power to the power of ½ and to the measurement number to the power of ¼, and as the advantage of increased peak power is greater than the effect of decreased measurement number, the detectable distance may be increased. Moreover, as no addressable light source, which requires individual adjustment, and a photodetector, which requires individual pixel detection, are required, the expense for the pulse light source 21 and the photodetector 51 may be reduced.

Furthermore, when applying the 3D distance information acquisition system 10 according to an embodiment based on the non-mechanical beam steering method to a mobile environment, it may be feasible in terms of speed and efficiency, and it may design an optical path in the form of folded optic to be configured to a thickness of about 4 mm or less considering the mobile environment.

That is, as the 3D distance information acquisition system 10 according to an embodiment described above includes the spatial light modulator 30 operating as a beam steering element based on a phase modulation array and collect power of light emitted from the pulse light source 21 to detect the same in only one direction, sufficient optical power and detectable distance may be secured while satisfying a form factor of a mobile device. Accordingly, the 3D distance information acquisition system 10 of an embodiment may be applied as, for example, a LIDAR sensor for mobile devices, a distance sensor, a 3D sensor, etc., and may implement a mobile device with a depth camera, etc. for mobile devices.

In addition to the foregoing, the 3D distance information acquisition system 10 according to an embodiment may be applied to various electronic devices, which require a LiDAR sensor, a distance sensor, a 3D sensor, etc. For example, a LIDAR sensor to which the 3D distance information acquisition system 10 according to an embodiment is applied may be applied to a moving object such as an autonomous vehicle, a drone, etc., a mobile device, a small transportation means (e.g., a bicycle, a motorcycle, a stroller, a board, etc.), a robot, an assistance means for animals and humans (e.g., a cane, a helmet, accessories, clothes, a watch, a bag, etc.), an Internet of Things device/system, a security device/system, etc.

Moreover, the 3D distance information acquisition system 10 according to an embodiment may also be applied to various systems other than the LiDAR sensor. As the 3D distance information acquisition system 10 according to an embodiment may obtain 3D information of a space and an object, it may be applied to a 3D image acquisition device, a 3D camera, etc.

Figure 15:
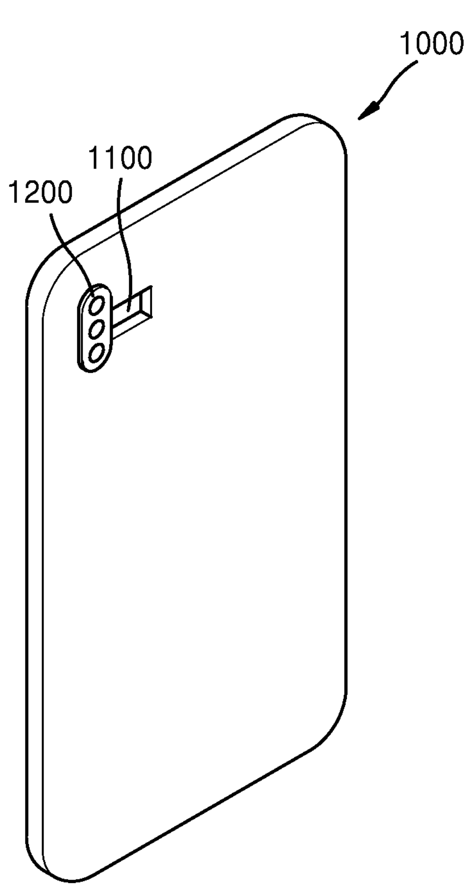
FIG. 15 is a conceptual diagram illustrating an example where a 3D distance information acquisition system is applied to a mobile device.

FIG. 15 is a conceptual diagram illustrating a case where the 3D distance information acquisition system 10 according to an embodiment is applied to a mobile device 1000. FIG. 15 illustrates an example in which a plurality of cameras 1200 and a 3D distance information acquisition system 1100 are applied on a rear side of the mobile device 1000. The 3D distance information acquisition system 1100 may be mounted on the mobile device 1000 and may be implemented as a LIDAR sensor for mobile devices. The 3D distance information acquisition system 1100 may be combined with the plurality of cameras 1200 and may be implemented as an ultra-small depth camera for mobile devices obtaining a 3D image. The 3D distance information acquisition system 10 according to an embodiment described above may be applied as the 3D distance information acquisition system 1100. By obtaining through the 3D distance information acquisition system 1100 distance information of an object to be photographed with the camera 1200, and applying the distance information to focus adjustment of the camera or to a photographed moving image or a photographed image, 3D information of the object may be obtained.

Figure 16:
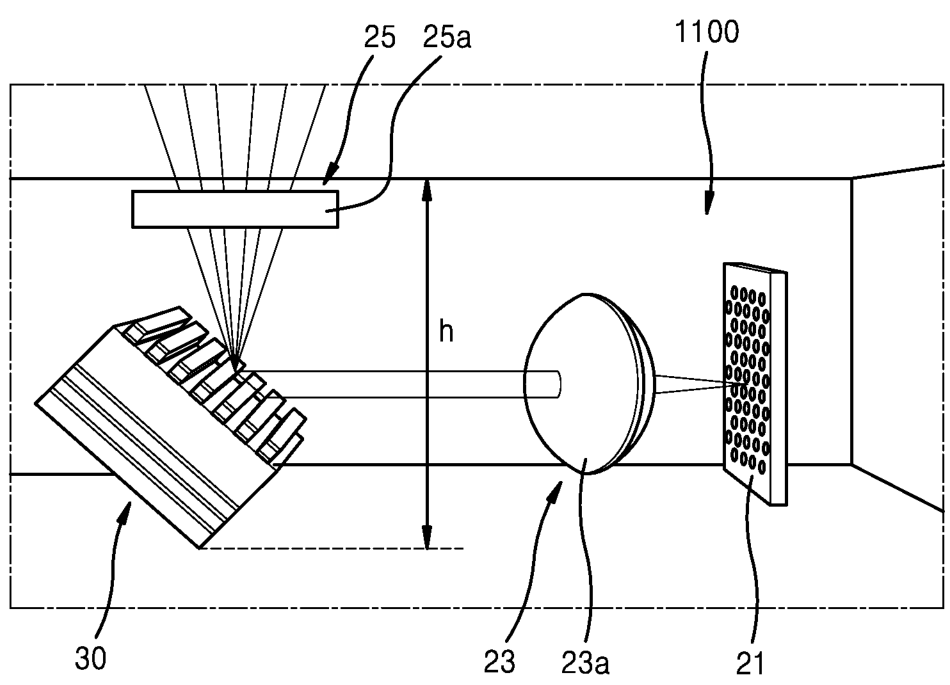
FIG. 16 is a diagram illustrating an example where a transmitter of a 3D distance information acquisition system is arranged in a mobile device.

FIG. 16 illustrates an example in which a transmitter of the 3D distance information acquisition system 1100 is disposed inside the mobile device 1000 of FIG. 15. FIG. 16 illustrates an example in which the transmitter 20 of FIG. 6A is applied as a folded optic; however, the transmitter 20 of FIG. 6B may also be applied as the folded optic.

As illustrated in FIG. 16, when using the spatial light modulator 30 operating as a beam steering element based on a reflective phase modulation array to the 3D distance information acquisition system 1100, the beam steering may be implemented in a folded optic structure. The spatial light modulator 30 may be disposed to form an angle of about 45° or other inclination angle with an internal bottom of the mobile device 1000. As illustrated in FIG. 16, when a folded optic is configured by using the spatial light modulator 30 operating as a beam steering element based on a reflective phase modulation array to the 3D distance information acquisition system 1100, a height h of the folded optic may be sufficiently small, e.g., about 4 mm or less.

Figure 17A:
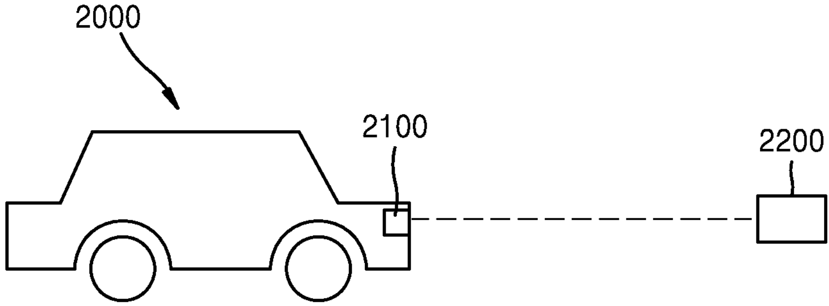
FIGS. 17A and 17B are conceptual diagrams illustrating an example where a 3D distance information acquisition system is applied to a vehicle.
Figure 17B:
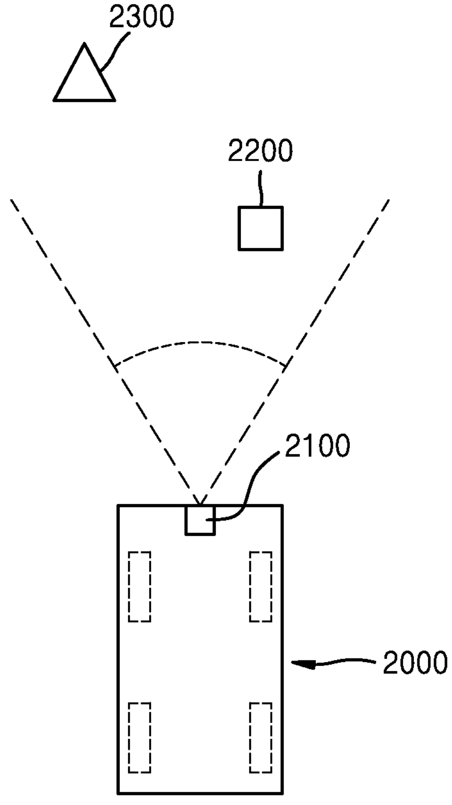

FIGS. 17A and 17B are conceptual diagrams illustrating an example where the 3D distance information acquisition system 10 according to an embodiment is applied to a vehicle 2000. FIG. 17A is a diagram illustrating a side view of the example, and FIG. 17B is a diagram illustrating a top view of an example.

With reference to FIG. 17A, the 3D distance information acquisition system 10 according to an embodiment may be implemented as a LIDAR device 2100 and applied to the vehicle 2000, and by using this, information about an object 2200 may be obtained. The vehicle 2000 may be an automobile having an autonomous driving function. By using the LiDAR device 2100, an object or person, i.e., the object 2200, located in a driving direction of the vehicle 2000 may be detected. In addition, by using information such as a time difference between transmission signals and detection signals, a distance to the object 2200 may be measured. Moreover, as illustrated in FIG. 17B, information on the nearby object 2200 and a distant object 2300 within a scanning range may be obtained.

According to the 3D distance information acquisition system of an embodiment, as the spatial light modulator operating as a beam steering element based on a phase modulation array is provided, and power of light emitted from the light source is collected all at once and detected in one direction, sufficient optical power may be secured, and thus a sufficient detectable distance may be secured when obtaining 3D distance information.

Moreover, according to the 3D distance information acquisition system of an embodiment, as it may meet a form factor of a mobile device may be satisfied, the 3D distance information acquisition system may be applied as a LIDAR sensor, a distance sensor, a 3D sensor, etc. for a mobile device, and accordingly, a mobile device with a depth camera for mobile device may be implemented.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A three-dimensional (3D) distance information acquisition system comprising:

a transmitter comprising a light source configured to emit a light based on a time division method and a spatial light modulator configured to steer the light incident from the light source to each scan point on an object;

a receiver comprising a photodetector configured to detect the light reflected from the scan point of the object; and a processor configured to obtain 3D distance information based on the light detected by the receiver, wherein the spatial light modulator comprises:

a first material layer;

a cavity provided on an entirety of a surface of the first material layer, the light incident being resonated in the cavity; and a second material layer comprising a grating structure provided on the cavity, and wherein the second material layer comprises:

a first doped semiconductor layer contacting the cavity;

an intrinsic semiconductor layer contacting the first doped semiconductor layer; and a second doped semiconductor layer contacting the intrinsic semiconductor layer.

2. The 3D distance information acquisition system of claim 1, wherein the spatial light modulator comprises a plurality of pixels for steering the light incident by phase modulation, and each of the plurality of pixels comprises a stacked structure comprising the first material layer, the cavity, and the second material layer.

3. The 3D distance information acquisition system of claim 1, wherein the grating structure comprises any one of a positive-intrinsic-negative (PIN) semiconductor structure, a negative-intrinsic-negative (NIN) semiconductor structure, and a positive-intrinsic-positive (PIP) semiconductor structure.

4. The 3D distance information acquisition system of claim 1, wherein the cavity comprises SiO2, and the grating structure comprises a PIN structure comprising Si.

5. The 3D distance information acquisition system of claim 1, wherein a pitch of the grating structure is less than a wavelength of the light modulated by the spatial light modulator.

6. The 3D distance information acquisition system of claim 1, wherein the first material layer comprises a distributed Bragg reflector.

7. The 3D distance information acquisition system of claim 6, wherein the first material layer comprises a structure in which Si layers and SiO2 layers are repeatedly stacked.

8. The 3D distance information acquisition system of claim 1, wherein the spatial light modulator is provided to modulate a phase by controlling a resonance condition by changing a refractive index of the grating structure by external electric stimulation.

9. The 3D distance information acquisition system of claim 1, wherein the spatial light modulator is a transmissive type or a reflective type.

10. The 3D distance information acquisition system of claim 1, wherein the light source comprises any one of an edge emitting laser, a vertical cavity surface emitting laser, and a photonic crystal surface emitting laser.

11. The 3D distance information acquisition system of claim 1, wherein the transmitter further comprises a collimating lens configured to collimate the light emitted from the light source.

12. The 3D distance information acquisition system of claim 1, wherein the transmitter further comprises an outgoing optical system, and the outgoing optical system comprises a diverging lens configured to expand a range of beam steering by the spatial light modulator.

13. The 3D distance information acquisition system of claim 12, wherein the diverging lens comprises a concave lens or a cylinder lens in which at least one lens surface is concave.

14. The 3D distance information acquisition system of claim 1, wherein the photodetector comprises any one of a silicon photomultiplier (SiPM), an avalanche photo diode (APD), and a single photon avalanche diode (SPAD).

15. The 3D distance information acquisition system of claim 1, wherein, when a direction in which the light emitted from the light source proceeds towards the spatial light modulator is a first proceeding direction, and a direction in which the light steered by the spatial light modulator proceeds is a second proceeding direction, the spatial light modulator is disposed to be inclined with respect to a plane that extends in the first proceeding direction and the second proceeding direction.

16. The 3D distance information acquisition system of claim 1, wherein, when a direction in which the light emitted from the light source proceeds towards the spatial light modulator is a first proceeding direction, and a direction in which the light steered by the spatial light modulator proceeds is a second proceeding direction, the spatial light modulator is disposed to be perpendicular to a plane that extends in the first proceeding direction and the second proceeding direction, and further comprises an inclined mirror member configured to reflect the light steered by the spatial light modulator in a direction out of the plane.

17. An electronic device comprising at least one sensor of a distance sensor, a three-dimensional (3D) sensor, and a light detection and ranging (LiDAR) sensor, wherein the 3D distance information acquisition system of claim 1 is provided as the at least one sensor.

18. The electronic device of claim 17, wherein the at least one sensor comprises a LiDAR sensor or a depth camera for a mobile device.

19. A distance sensor comprising:

a transmitter comprising:

a light source configured to turn on all semiconductor-based laser diodes of the light source at each scan time, and emit a collimated pencil beam using the semiconductor-based laser diodes at each scan time; and a spatial light modulator configured to steer the collimated pencil beam incident from the light source to each scan point on an object;

a receiver comprising a photodetector configured to detect light reflected from the scan point of the object; and a processor configured to obtain 3D distance information based on the light detected by the receiver, wherein the spatial light modulator comprises:

a first material layer;

a cavity provided on an entirety of a surface of the first material layer, the light incident being resonated in the cavity; and a second material layer comprising a grating structure provided on the cavity, and wherein the second material layer comprises:

a first doped semiconductor layer contacting the cavity;

an intrinsic semiconductor layer contacting the first doped semiconductor layer; and a second doped semiconductor layer contacting the intrinsic semiconductor layer.

* * * * *